United States Patent [19]
Hayase et al.

[11] Patent Number: 5,340,684
[45] Date of Patent: Aug. 23, 1994

[54] PHOTOSENSITIVE COMPOSITION AND RESIN-ENCAPSULATED SEMICONDUCTOR DEVICE

[75] Inventors: Rumiko Hayase, Kawasaki; Masayuki Oba, Yokohama; Naoko Kihara, Matsudo; Yukihiro Mikogami, Yokohama, all of Japan

[73] Assignee: Kabushiki Kaisha Toshiba, Kawasaki, Japan

[21] Appl. No.: 158,490

[22] Filed: Nov. 29, 1993

Related U.S. Application Data

[63] Continuation of Ser. No. 623,536, Dec. 7, 1990, abandoned.

[30] Foreign Application Priority Data

Dec. 7, 1989 [JP] Japan ................... 1-316377
Mar. 9, 1990 [JP] Japan ................... 2-56433

[51] Int. Cl.$^5$ .................. G03F 7/023; G03F 7/115
[52] U.S. Cl. ................... 430/165; 430/167; 430/189; 430/192; 430/193; 430/197; 430/273; 430/320; 430/905; 430/165
[58] Field of Search ........... 430/192, 193, 165, 905, 430/273, 320, 189, 167, 197

[56] References Cited

U.S. PATENT DOCUMENTS

| | | | |
|---|---|---|---|
| 3,687,663 | 8/1972 | Bloom | 430/323 |
| 4,268,602 | 5/1981 | Yoshino et al. | 430/192 |
| 4,339,521 | 7/1982 | Ahne et al. | 430/193 |
| 4,395,482 | 7/1983 | Ahne et al. | 430/326 |
| 4,480,009 | 10/1984 | Berger | 528/26 |
| 4,551,409 | 11/1985 | Gulla et al. | 430/197 |
| 4,565,767 | 1/1986 | Kataoka et al. | 430/270 |
| 4,601,969 | 7/1986 | Clecak et al. | 430/192 |
| 4,656,116 | 4/1987 | Rohde et al. | 430/197 |
| 4,752,551 | 6/1988 | Schwartzkopf | 430/192 |
| 4,783,391 | 11/1988 | Ohbayashi et al. | 430/197 |
| 4,803,147 | 2/1989 | Mueller et al. | 430/906 |
| 4,927,736 | 5/1990 | Mueller et al. | 430/176 |
| 5,057,399 | 10/1991 | Flaim et al. | 430/271 |
| 5,104,768 | 4/1992 | Sassmannshausen et al. | 430/906 |
| 5,122,436 | 6/1992 | Tunney et al. | 430/906 |

FOREIGN PATENT DOCUMENTS

| | | |
|---|---|---|
| 0230615 | 8/1987 | European Pat. Off. . |
| 0300326 | 1/1989 | European Pat. Off. . |
| 3841571 | 6/1989 | Fed. Rep. of Germany . |
| 2335960 | 7/1977 | France . |
| 56-27140 | 8/1980 | Japan . |
| 64-60630 | 7/1988 | Japan . |

OTHER PUBLICATIONS

Journal of Photopolymer Science and Technology, vol. 2 (1); H. Mochizuki et al; "Preparation and Properties of Positive Photosensitive . . . "; pp. 43–44.

*Primary Examiner*—Charles L. Bowers, Jr.
*Assistant Examiner*—John S. Chu
*Attorney, Agent, or Firm*—Oblon, Spivak, McClelland, Maier & Neustadt

[57] ABSTRACT

A photosensitive composition contains a polyimide constituted by a repeating unit having a hydroxyl group and a repeating unit having a siloxane bond, or a repeating unit having a hydroxyl group, a repeating unit having a siloxane bond, and a repeating unit other than these two repeating units, and a photosensitive agent consisting of an ester compound or an amide-ester compound of naphthoquinonediazidesulfonic acid or benzoquinonediazidesulfonic acid. The photosensitive composition is used as a passivation film of a semiconductor device or a photoresist.

18 Claims, 1 Drawing Sheet

PHOTOSENSITIVE COMPOSITION AND RESIN-ENCAPSULATED SEMICONDUCTOR DEVICE

This application is a continuation of application Ser. No. 07/623,536, filed on Dec. 7, 1990, now abandoned.

Background of the Invention

1. Field of the Invention

The present invention relates to a photosensitive composition and a semiconductor device having a passivation film consisting of the photosensitive composition.

2. Description of the Related Art

Since an element formed on a semiconductor substrate is easily influenced by external environments, a passivation film is formed to keep reliability of the element. As a material of the passivation film, inorganic materials such as silicon dioxide, silicon nitride, and alumina are used. A resin-encapsulated semiconductor device has a passivation film formed on a semiconductor substrate and consisting of an inorganic material as described above and is encapsulated by an epoxy resin composition or the like. An encapsulating resin such as an epoxy resin, however, has a property of permeating water. In addition, as the size of a semiconductor pellet is increased, a passivation film cracks more easily upon solder dipping due to a difference between thermal expansion coefficients of an encapsulating resin and a pellet. Therefore, a wiring pattern consisting of aluminum is corroded by ingress of water.

In order to solve this problem, a passivation film consisting of a polyimide is further formed on the passivation film consisting of an inorganic material. Since film formation can be performed by a simple process and a stabilizing treatment at a comparatively low temperature can be adopted, a polyimide resin has been widely used in recent years. In these applications, a hole must be formed in the polyimide passivation film on a pad to be connected to an external lead by using a photoresist. In addition, in order to use a polyimide as an insulating interlayer, a similar process must be performed. If, however, photosensitivity is imparted to a polyimide, the process can be simplified.

In the field of semiconductor manufacture, an integrated circuit or a circuit for a printed circuit board is formed by microlithography using a photoresist. It is known that a positive photoresist can be advantageously used in formation of a fine relief pattern. As a positive photoresist, a composition of a novolak resin and a naphthoquinonediazide-based photosensitive agent is conventionally used. As the naphthoquinonediazide-based photosensitive agent, the following compounds are known.

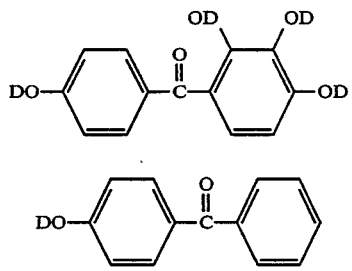

-continued

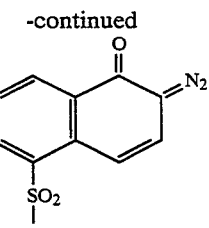

Since, however, a conventional resist is inferior in heat resistance, its pattern is deformed at a temperature of 110° C. to 130° C. Therefore, a conyenriohal process adopts a method in which a resist is developed and then cured by radiating ultraviolet rays, or a method (step baking) in which a resist is heated up to a temperature slightly lower than a heat deformation temperature to cause a crosslinking reaction, and the temperature is gradually increased thereby completing curing.

In addition, since the size in the longitudinal direction of an integrated circuit is not so much reduced as that in the transverse direction, the sizes of steps on a substrate tend to be increased. Accordingly, a ratio (aspect ratio) of the height with respect to the width of a resist pattern is increased. Under the circumstances, it is very difficult to increase the dimensional precision of a resist pattern. Furthermore, as a minimum size is reduced, specific problems arise in various types of exposure methods. For example, in ultraviolet ray exposure, the dimensional precision of a resist pattern is largely degraded by interference of reflected light based on steps on a semiconductor substrate. In electron beam exposure, an aspect ratio of a resist pattern cannot be increased due to a proximity effect produced by backscattering of electrons.

A multilayered resist process has been developed as a method of solving the above problems. The multilayered resist process is summarized in, e.g., "Solid State Technology", 74 (1981). Currently, a method which is generally often attempted is a three-layered resist system. This resist system is constituted by a lower layer having functions of flattening steps on a semiconductor substrate and preventing reflection from the substrate, an intermediate layer serving as a mask for etching the lower layer, and an upper layer as a photosensitive layer. In the three-layered resist process, although a finer pattern than that obtained by a monolayered resist method can be advantageously formed, the number of steps until pattern formation is increased.

In order to simplify the process, a two-layered resist system using a silicon-containing resist has been proposed. In the two-layered resist system, the silicon-containing resist has functions of both the upper layer and the intermediate layer of the three-layered resist system. Since, however, a conventional silicon-containing resist generally has a low glass transition point, a treatment such as ultraviolet curing or step baking must be performed in order to prevent pattern deformation upon etching of a lower layer.

In view of the above, development of a photosensitive composition containing a heat-resistant polymeric compound such as a polyimide has recently become a big concern.

Negative photosensitive compositions in which a crosslinking reaction progresses upon light radiation are disclosed in Published Unexamined Japanese Patent Application No. 49-115541, Published Examined Japanese Patent Application No. 59-52822, Published Unexamined Japanese Patent Application Nos. 59-219330, 54-145794, and 59-108031.

Since, however, the negative photosensitive composition uses an organic solvent as a developing solution, a relief pattern swells to degrade resolution. In addition, the use of a large amount of an organic solvent is undesirable in consideration of environmental health and fire prevention.

Positive photosensitive compositions in which a light-exposed portion is dissolved in a solvent are disclosed in Published Unexamined Japanese Patent Application Nos. 62-145239, 62-145240, and 64-60630. Of these compositions, a composition disclosed in Published Unexamined Japanese Patent Application No. 64-60630 uses hydroxy-substituted polyimide and a naphthoquinonediazide-based photosensitive agent.

A positive photosensitive composition is generally developed by an aqueous alkali solution and has higher resolution than that of a negative photosensitive composition. A conventional positive photosensitive composition, however, has a poor adhesion property with respect to a substrate.

SUMMARY OF THE INVENTION

It is an object of the present invention to provide a photosensitive composition which has high heat resistance, resolution, and exposure sensitivity and a satisfactory adhesion property with respect to a substrate and can be effectively used as a passivation film or a monolayered or two-layered resist, and a semiconductor device having a passivation film consisting of the photosensitive composition.

A photosensitive composition (to be referred to as a photosensitive composition 1 hereinafter) of the present invention contains a photosensitive agent and a polyimide having repeating units represented by the following formulas (I) and (II):

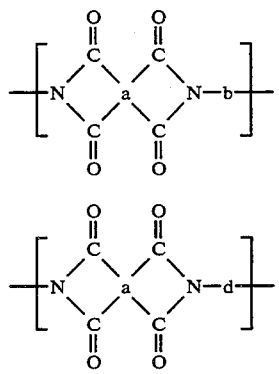

wherein a represents a tetravalent aromatic group, b represents a divalent aromatic group having a hydroxyl group, and d represents a divalent group containing silicon represented by the following formula (III):

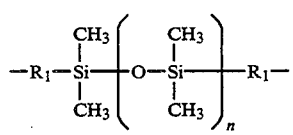

wherein $R_1$ represents a substituted or unsubstituted alkylene group having 1 to 10 carbon atoms, a substituted or unsubstituted aromatic group having 1 to 10 carbon atoms, and n represents an integer of 1 to 6.

A photosensitive composition (to be referred to as a photosensitive composition 2 hereinafter) of the present invention contains a photosensitive agent and a polyimide having repeating units represented by the above formulas (I) and (II) and the following formula (IV):

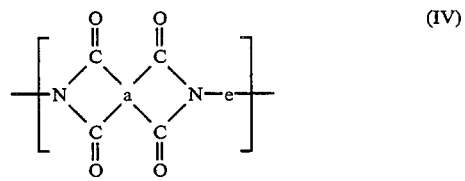

wherein a represents a tetravalent aromatic group and e represents a divalent aromatic group.

The photosensitive composition of the present invention is excellent in a heat resistance, a resolution, an exposure sensitivity, and an adhesion property with respect to a substrate.

In addition, since the photosensitive composition of the present invention has an oxygen RIE-resistant property, a pattern having a good sectional shape with a high aspect ratio can be formed by performing dry etching with an oxygen plasma by using a pattern of the photosensitive composition as an oxygen RIE mask with respect to a lower layer. Therefore, the photosensitive composition of the present invention can be suitably used as a two-layered resist.

Additional objects and advantages of the invention will be set forth in the description which follows, and in part will be obvious from the description, or may be learned by practice of the invention. The objects and advantages of the invention may be realized and obtained by means of the materials and combinations particularly pointed out in the appended claims.

BRIEF DESCRIPTION OF THE DRAWINGS

The accompanying drawing, which is incorporated in and constitutes a part of the specification, illustrates presently one of the preferred embodiment of the invention and, together with the general description given above and the detailed description of the preferred embodiments given below, serves to explain the principles of the invention.

DETAILED DESCRIPTION OF THE PREFERRED EMBODIMENTS

Figure 1:
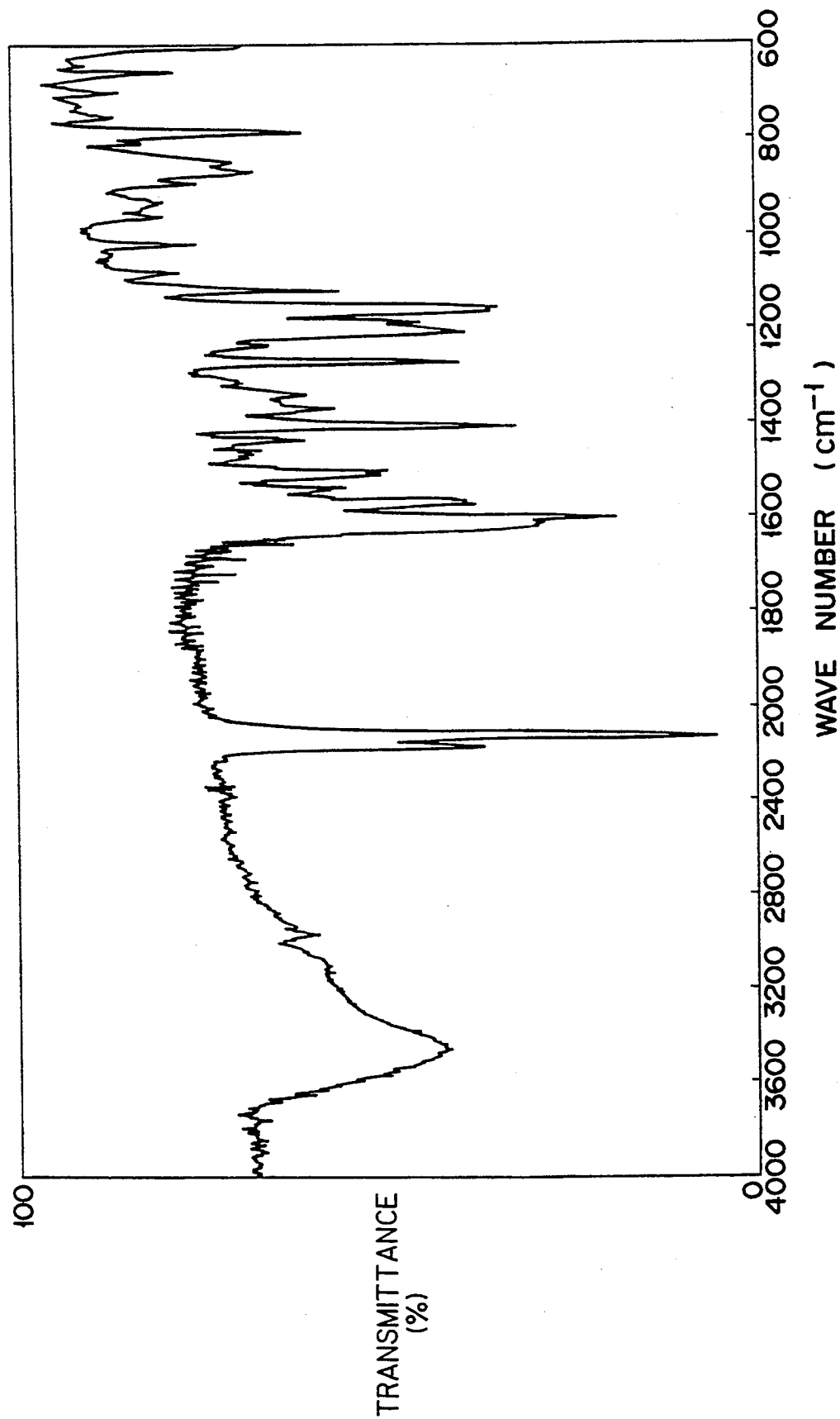
FIG. 1 is a graph showing an IR spectrum of a photosensitive agent synthesized in an embodiment of the present invention.

In the present invention, a polyimide is synthesized by a reaction between a tetracarboxylic acid dianhydride represented by the following formula:

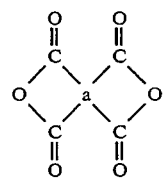

and a diamine represented by $H_2N$-b-$NH_2$ and $H_2N$-d-$NH_2$, or $H_2N$-b-$NH_2$, $H_2N$-d-$NH_2$, and $H_2N$-e-$NH_2$.

In repeating units constituting the polyimide and represented by the formulas (I), (II), and (IV), a represents a tetravalent aromatic group and contains at least one benzene nucleus or naphthalene nucleus. Examples of a are, as will be listed in Table 1 to be presented later, a substituted or unsubstituted benzene nucleus, a substituted or unsubstituted naphthalene nucleus, and a substituted or unsubstituted polyphenyl nucleus having a maximum of five phenyl rings. Examples of a structural unit represented by a will be listed in Table 2 to be presented later.

Examples of a tetracarboxylic acid dianhydride having the above structural unit are a pyromellitic acid dianhydride, 3,3', 4,4 '-benzophenonetetracarboxylic acid dianhydride 2 3 3'4'-benzophenonetetracarboxylic acid dianhydride, 3,3'4,4 '-biphenyltetracarboxylic acid dianhydride, bis( 3,4-dicarboxyphenyl )methane dianhydride, 2,2-bis ( 3,4-dicarboxyphenyl) propane dianhydride, 2,2-bis ( 3,4-dicarboxyphenyl)hexafluoropropane dianhydride, bis ( 3,4-dicarboxyphenyl)sulfone dianhydride, bis( 3,4-dicarboxyphenyl)dimethylsilane dianhydride, bis( 3,4-dicarboxyphenyl) tetramethyldisiloxane dianhydride, 1,4,5,8-naphthalenetetracarboxylic acid dianhydride, 2,3,6,7-naphthalenetetracarboxylic acid dianhydride, and butanetetracarboxylic acid dianhydride. One or more types of the above dianhydrides are used as the tetracarboxylic acid dianhydride.

In a repeating unit constituting the polyimide and represented by the formula (I), b represents a divalent group having at least one hydroxyl group. An example of the divalent group has 1 to 6 benzene rings as represented by the following formula:

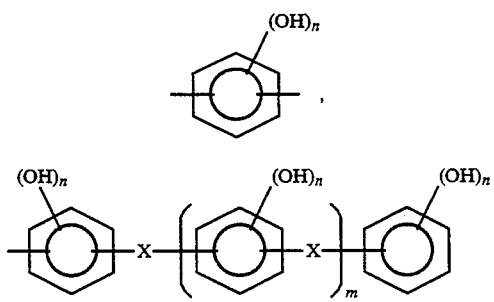

wherein m represents an integer of 0 to 4 and n represents an integer from 0 to 3. Examples of a structural unit represented by b will be listed in Table 3 to be presented later.

Examples of the diamine having the above structural unit are 3,3'-dihydroxy-4,4 '-diaminobiphenyl, 3,3'-diamino-4,4 '-dihydroxybiphenyl, 2,2-bis ( 3-hydroxy-4-aminophenyl ) hexafluoropropane, 2,2-bis ( 3-amino-4-hydroxyphenyl )hexafluoropropane, 2- ( 3-hydroxy-4-aminophenyl )-2-( 3 '-amino-4'-hydroxyphenyl) hexafluoropropane, 3,3 '-dihydroxy-4,4 '-diaminodiphenylsulfone, 3,3 '- diamino-4,4 '-dihydroxydiphenylsulfone, 3,3 '-dihydroxy-4,4 '-diaminobenzophenone, 3,3'-diamino-4,4 '-dihydroxybenzophenone, 3,3'-dihydroxy-4,4 '-diaminodiphenyl ether, 3,3 '-diamino-4,4 '-dihydroxydiphenyl ether, 3,3'-dihydroxy-4,4 '-diaminodiphenylmethane, 2,6-diaminophenol, 2,4-diaminophenol, 3,5-diaminophenol, 3-hydroxy-4,4 '-diaminobiphenyl, 4-hydroxy-3,3'-diaminobiphenyl, 2-( 3-amino-4-hydroxyphenyl )- 2-( 3 '-aminophenyl )hexafhoropropane, 3-hydroxy-4,4 '-diaminodiphenylsulfone, 3-hydroxy-4,4 '-diaminodiphenyl ether, and 3-hydroxy-4,4 '-diaminophenylmethane. One or more types of these compounds are used as diamine having a hydroxyl group.

In a repeating unit constituting the polyimide and represented by formula (II), d represents a divalent group containing silicon represented by formula (III):

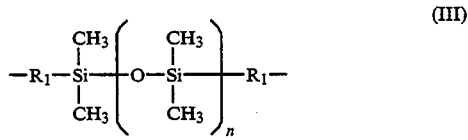

wherein $R_1$ represents a substituted or unsubstituted alkylene group having 1 to 10 carbon atoms or a substituted or unsubstituted aromatic group having 1 to 10 carbon atoms. Examples of the alkylene group are a methylene group, an ethylene group, an n-propylene group, iso-propylene group, an n-butylene group, a secbutylene group, a t-butylene group, an n-pentylene group, an n-hexylene group, an n-octylene group, an n-nonylene group, and an n-decanyl group. Examples of the aromatic group are a phenylene group, a hydroxyphenylene group, a methoxyphenylene group, a methylphenylene group, a naphthylene group, a chlorophenylene group, and a bromophenylene group. Examples of a structural unit represented by d will be listed in Table 4 to be presented later.

Examples of the diamine having the above structural unit are his( 2-aminoethyl ) tetramethyldisiloxane, bis(γ-aminopropyl )tetramethyldisiloxane, bis( 4-aminobutyl )tetramethyldisiloxane, and bis(γ-aminopropyl)octamethyltetrasiloxane. One or more types of these compounds are used as diamine containing silicon.

In a repeating unit constituting the polyimide and represented by formula (IV), e represents a divalent group represented by the following formula and not having a hydroxyl group:

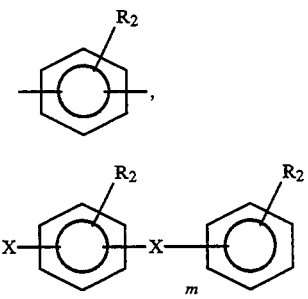

wherein $R_2$ represents a substituted or unsubstituted alkyl, alkoxyl, aryl, or acyl group having 1 to 10 carbon atoms, a halogen atom, or a hydrogen atom and m represents an integer of 0 to 4. Examples of a structural unit represented by e will be listed in Table 5 to be presented later.

Examples of the diamine having the above structural unit are m-phenylenediamine, p-phenylenediamine, 2,4-tolylenediamine, 3,3'-diaminodiphenyl ether, 4,4 '-diaminodiphenyl ether, 3,4 '-diaminodiphenyl ether, 3,3'-diaminodiphenylsulfone, 4,4 '-diaminodiphenylsulfone, 3,4 '-diaminodiphenylsulfone, 3,3'-diaminodiphenylmethane, 4,4 '-diaminodiphenylmethane, 3,4 '-diaminodiphenylmethane, 4,4 '-diaminodiphenylsulfide, 3,3'-diaminodiphenylketone, 4,4 '-diaminodiphenylketone, 3,4 '-diaminodiphenylketone, 2,2'-bis (p-aminophenyl) propane, 2,2'-bis (p-aminophenyl)hexafluoropropane, 1,3-his (m-aminophenoxy)benzene, 1,3-his (p-aminophenoxy) benzene, 1,4-bis(p-aminophenoxy)benzene, 4-methyl-2,4-bis(p-aminophenyl)-1-pentene, 4-methyl-2,4-bis (p-aminophenyl) - 2-pentene, 1,4-bis($\alpha,\alpha$-dimethyl-p-aminolbenzyl )benzene, imino-di-p-phenylenediamine, 1,5-diaminonaphthalene, 2,6-diaminonaphthalene, 4-methyl-2,4-bis (p-aminophenyl)penfane, 5( or 6 )-amino- 1- (p-aminophenyl) - 1,3,3-trimethylindane, bis (p-aminophenyl)phosphineoxide, 4,4 '-diaminoazobenzene, 4,4 '-diaminodiphenylurea, 4,4'-bis (p-aminophenoxy)biphenyl, 2,2-his [p- (p'-aminophenoxy ) phenyl ]propane, 2,2-bis [p-(m-aminophenoxy)phenyl ]benzophenone, 4,4'-his (p-aminophenoxy)diphenylsulfone, 4,4-bis [p- ($\alpha,\alpha$-dimethyl-p'-aminobenzyl) phenoxy ]benzophenone, 4,4-bis [p- ($\alpha,\alpha$-dimethyl -p'-aminobenzyl ) phenoxy ]diphenylsulfone, bis( 4-aminophenyl )dimethylsilane, and bis( 4-aminophenyl ) tetramethyldisiloxane. Note that a hydrogen atom of an aromatic nucleus of the above aromatic diamine may be substituted by at least one substituting group selected from the group consisting of a chlorine atom, a fluorine atom, a bromine atom, a methyl group, a methoxy group, a cyano group, and a henyl group. One or more types of the above compounds are used as diamine not containing a hydroxyl group.

More specifically, a polyimide is synthesized as follows in the present invention. First, a tetracarboxylic acid dianhydride and a diamine as described above are polycondensation-reacted in an organic solvent to synthesize polyamic acid as a precursor of the polyimide. Examples of the organic solvent used in this reaction are N ,N-dimethylformamide, N,N-dimethylacetoamide, N-methyl-2-pyrrolidone, N-methyl-$\gamma$-caprolactam, y-butyrolactone, sulfolane, N,N,N',N'-tetramethylurea, hexamethylphosphoramide, tetrahydrofuran, and dioxane. In this reaction, a ratio between the diamine and tetracarboxylic acid dianhydride is preferably 0.9 to 1.1: 1 (molar ratio). The reaction conditions are generally a reaction temperature of $-20°$ C. to $100°$ C. and a reaction time of 10 minutes to 20 hours.

A polyimide can be synthesized from the obtained polyamic acid solution by, e.g., the following method.

(1) In the presence of an organic alkali such as triethylamine, an acid anhydride such as acetic anhydride is used to cause a reaction at 1° C. to 100° C. for 30 minutes to 10 hours, thereby dehydrating and cyclizing the polyamic acid to synthesize a polyimide.

(2) In the presence of methylsulfonic acid, phosphorus pentoxide or polyphosphoric acid is used to dehydrate and cyclize the polyamic acid, thereby synthesizing a polyimide.

(3) An organic solvent such as benzene, toluene, xylene, or chlorobenzene which is azeotropic with water is added to the synthesized polyamic acid solution, and the resultant solution is heated up to a temperature higher than azeotropic points of these organic solvents, e.g., 150° C. to 180° C. for 1 to 24 hours. While byproduced water is distilled out of the system, the polyamic acid is dehydrated and cyclized to synthesize a polyimide.

The polyimide solution obtained as described above is injected in a large amount of alcohol or water to reprecipitate the polyimide, and the reprecipitated polyimide is filtered out and dried.

Ratios of repeating units constituting the polyimide and represented by formulas (I), (II), and (IV) are preferably arbitrarily selected in accordance with whether the photosensitive compositions 1 and 2 are applied to (1) a passivation film (or an insulating interlayer), ( 2 ) a monolayered resist, or ( 3 ) a two-layered resist.

( 1 ) Passivation Film (or Insulating Interlayer)

(1—1) If a polyimide of the photosensitive composition 1 is to be used, the ratios are preferably (I) 80 to 99 mol % and (II) 1 to 20 mol %, and more preferably, (I) 85 to 95 mol % and (II) 5 to 15 mol %. (1-2) If a polyimide of the photosensitive composition 2 is to be used, the ratios are preferably (I) 40 to 98 mol %, (II) 1 to 20 mol %, and (IV) 1 to 40 mol %, and more preferably, (I) 60 to 93 mol %, (II) 2 to 15 mol %, and (IV) 5 to 25 mol %.

In a passivation film, a repeating unit represented by formula (II) has effects of increasing an adhesion strength and decreasing a stress. Even if the ratio of a repeating unit represented by formula (II) is low, these effects can be satisfactorily obtained. If, however, the ratio of a repeating unit represented by formula (II) is too high, a glass transition point (Tg) of the polyimide may be lowered to cause deformation of the polyimide upon solder dipping (about 260° C). Therefore, the ratio of a repeating unit represented by formula (II) preferably falls within the above-mentioned range. In addition, the ratios of repeating units represented by formulas (I)and (IV) preferably fall within the above-mentioned ranges in order to optimize development characteristics.

(2) Monolayered resist (2-1) If a polyimide of the photosensitive composition 1 is to be used, the ratios are preferably (I) 50 to 99 mol % and (II) 1 to 50 mol %, and more preferably, (I) 70 to 95 mol % and (II) 5 to 30 mol %. (2—2) If a polyimide of the photosensitive composition 2 is to be used, the ratios are preferably ( I ) 40 to 98 mol %, (II) 1 to 20 mol %, and (Iv) 1 to 40 mol %, and more preferably, (I) 60 to 93 mol %, (II) 2 to 15 mol %, and (IV) 5 to 25 mol %.

In a monolayered resist, a repeating unit represented by formula (II) has an effect of increasing an adhesion strength. A requirement for a heat resistance is less strict in a monolayered resist than in a passivation film. For example, the heat resistance is satisfactory if deformation is not caused upon heating at 140° C. for about five minutes after pattern formation. Therefore, the ratios of repeating units represented by formulas (I), (II), and (IV) are selected within the above-mentioned ranges in consideration of development characteristics.

(3) Two-layered Resist (3-1) If a polyimide of the photosensitive composition 1 is to be used, the ratios are preferably (I) 50 to 90 mol % and (II) 10 to 50 mol %, and more preferably, (I) 55 to 80 mol % and (II) 20 to 45 mol %. (3-2) If a polyimide of the photosensitive composition 2 is to be used, the ratios are preferably (I) 40 to 89 mol %, (II) 10 to 45 mol %, and (Iv) 1 to 15 mol %, and more preferably, (I) 45 to 83 mol %, (II) 15 to 40 mol %, and (IV) 2 to 15 mol %.

If the photosensitive composition is used as the upper layer of a two-layered resist, the lower layer is processed by oxygen reactive ion etching (oxygen RIE) by using the pattern of the upper layer as a mask. For this reason, the upper layer is required to have a satisfactory oxygen RIE resistance. The oxygen RIE resistance is increased as a silicon content in a resist is increased. Therefore, the ratio of a repeating unit represented by formula (II) is preferably higher than that selected when the photosensitive composition is used as a passivation film or a monolayered resist.

In the present invention, examples of a photosensitive agent are a naphthoquinonediazide compound and a benzophenonediazide compound. When the naphthoquinonediazide compound or benzophenonediazide compound is mixed in an alkali-soluble resin, a nonexposed portion is dissolved in an aqueous alkali solution less easily than when only a resin is used, and an exposed portion is dissolved in an aqueous alkali solution more easily than when only a resin is used. Since a dissolution speed difference between the exposed and nonexposed portions with respect to an aqueous alkali solution is large, a resolution can be improved.

Examples of the naphthoquinonediazide compound or benzoquinonediazide compound are an ester compound of naphthoquinonazidesulfonic acid or benzoquinoneazidesulfonic acid and an amide-ester compound of naphthoquinonediazidesulfonic acid or benzoquinonediazidesulfonic acid. Examples of a residual group of naphthoquinonediazidesulfonic acid or benzoquinonediazidesulfonic acid serving as a photosensitive group in the above compounds are those represented by formulas $D_1$ to $D_6$ in Table 6 to be presented later.

The ester compound of naphthoquinonediazidesulfonic acid or benzoquinonediazidesulfonic acid has been widely used as a photosensitive agent for a positive resist. Examples of the compound are listed in Table 7 to be presented later.

These compounds can be obtained by condensing naphthoquinonediazidesulfonic acid chloride or benzoquinonediazidesulfonic acid chloride and a monomeric or polymeric compound having a hydroxyl group in the presence of a weak alkali. Examples of the hydroxyl compound are hydroquinone, resorcinol, phloroglucinol, 2,4-dihydroxybenzophenone, 2,3,4-trihydroxybenzophenone, 2,3,4,4 '-tetrahydroxybenzophenone, catechin, quercertin, quinizarin, purpurin, bisphenol A, hisphenol S, a novolak resin, and polyvinylphenol.

An amide-ester compound of naphthoquinonediazide-sulfonic acid or benzoquinonediazidesulfonic acid is represented by the following formula:

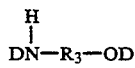

wherein $R_3$ represents a divalent aromatic group and D represents the residual groups $D_1$ to $D_6$ of naphthoqutnonedtazldesulfontc acid or benzoquinonediazidesulfonic acid shown in Table 6. Examples of $R_3$ in these compounds are listed in Table 8 to be presented later. The amide-ester compound of naphthoquinonediazidesulfonic acid or benzoquinonediazidesulfonic acid is a novel photosensitive agent. A photosensitive composition containing this compound is excellent in an adhesion property with respect to a substrate especially upon development. Therefore, the amide-ester compound of naphthoquinonediazidesulfonic acid or benzoquinonediazidesulfonic acid has an effect of improving an adhesion property with respect to a substrate not only when it is used in combination with a hydroxyl-substituted polyimide but also when it is used in combination with a novolak resin as in a conventional technique. Examples of the compound are listed in Table 9 to be presented later.

Of these compounds, an amide-ester compound of 1,2-naphthoquinone-2-diazide-4(or 5)-sulfonic acid represented by a formula:

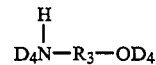

or a formula:

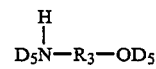

is most preferable since it has a large absorption peak on a comparatively long wavelength side.

These amide-ester compounds can be obtained by reacting a naphthoquinonediazidesulfonic acid halide or a benzoquinonediazidesulfonic acid halide with an aromatic aminohydroxy compound represented by the following formula.

wherein $R_3$ is defined as described above.

Examples of the aromatic aminohydroxy compound are p-aminophenol, m-aminophenol, 3-aminophenyl-4'-hydroxyphenyl ether, 4-aminophenyl-4'-hydroxyphenyl ether, 3-aminophenyl-4 '-hydroxyphenylmethane, 4-aminophenyl-4 '-hydroxyphenylmethane, 2-( 3-aminophenyl )-2-(4'-hydroxyphenyl)propane, 2- ( 4-aminophenyl ) - 2- ( 4'-hydroxyphenyl ) propane, 2- ( 3-aminophenyl ) - 2- ( 4'-hydroxyphenyl )hexafluoropropane, 2-( 4-aminophenyl )-2-( 4 '-hydroxyphenyl )hexafluoropropane, 3-hydroxyphenyl-4'-aminophenyl ether, 2- ( 3-hydroxyphenyl )-2-( 4 '-aminophenyl )propane, 2-( 3-hydroxyphenyl)-2-(4 '-aminophenyl)hexafluoropropane, 3-aminophenyl-, 3 '-hydroxyphenylmethane, 3-aminophenyl- 3 '-hydroxyphenyl ether, and 2-( 3-aminophenyl )-2-(3'-hydroxyphenyl )propane.

This synthesizing reaction is normally performed in an organic solvent. Examples of the organic solvent used in this reaction are acetone, methyl ethyl ketone, dioxane, tetrahydrofurane, cellosolve, methylcellosolve, cyclohexanone, ethylene chloride, chloroform, acetonitrile, methylacetate, ethylacetate, burylacerate, cellosolveacetate, dimethylformamide, and N-methyl-2-pyrrolidone. Since halogenated hydrogen is by-produced in this reaction, an alkali metal carbonate, an alkali metal bicarbonate, triethylamine, pyridine, ethylene oxide, or propylene oxide is preferably used in order to trap the halogenated hydrogen. This reaction is performed in, e.g., a yellow room which shields ultraviolet rays at 0° C. to 100° C. for 1 to 50 hours. An amide-ester compound produced by this reaction is extracted from a reaction solution mixture by using a solvent mixture of, e.g., ethylene chloride and water and then dried.

In the present invention, a diazo compound represented by the following formula can also be used as a photosensitive agent:

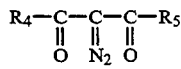

wherein $R_4$ and $R_5$ may be the same or different and independently represent a substituted or unsubstituted alkyl group having 1 to 20 carbon atoms, a substituted or unsubstituted aryl group, a substituted or unsubstituted alkyl group containing silicon and having 1 to 20 carbon atoms, or a substituted or unsubstituted aryl group containing silicon. This photosensitive agent forms a good pattern upon radiation of especially deep Uv. Examples of the diazo compound are listed in Table 10 to be presented later.

An azide compound, examples of which are listed in Table 11 to be presented later, can also be used as a photosensitive agent.

In the photosensitive composition 1 or 2 of the present invention, an alkali-soluble resin may be mixed as needed. The type of alkali-soluble resin is not particularly limited. Examples are those listed in Table 12 to be presented later. In addition, in the photosensitive composition 1 or 2 of the present invention, a sensitizer, a dye, a surfactant, and the like may be added as needed.

The photosensitive composition 1 or 2 of the present invention can be obtained by dissolving the polyimide and the photosensitive agent described above in an organic solvent. In this case, the polyimide may be used in the form of a solution by adjusting the concentration of a reaction solution after synthesis or in the form of an isolated solid body. The type of organic solvent is not particularly limited as long as it can dissolve the polyimide and the photosensitive agent. Examples of the solvent are a ketone-based solvent such as cyclohexanone, acetone, methyl ethyl ketone, and methyl isobutyl ketone; a cellosolve-based solvent such as methylcellosolve, methylcellosolveacetate, ethylcellosolveacetate, and butylcellosolveacetate; an ester-based solvent such as ethylacetate, burylacerate, and isoamylacetate; an ether-based solvent such as tetrahydrofurane and dioxane; N,N-dimethylformamide, N,N-dimethylacetoamide, N-methyl-2-pyrrolidone, N-methyl-γ-caprolactam, y-butyrolactone, sulfolane, N,N,N', N'-tetramethylurea, and hexamethylphosphoramide These solvents can be used singly or in the form of a mixture of two or more thereof.

A mixing amount of a photosensitive agent in the photosensitive composition 1 or 2 of the present invention is preferably 0.1 to 50 wt % assuming that a total amount of a resin containing the polyimide and the photosensitive agent is 100 wt %. If the amount of the photosensitive agent is less than 0.1 wt %, an exposure sensitivity of the photosensitive composition is decreased. If the amount of the photosensitive composition is more than 50 wt %, the performance of the photosensitive composition as a film is degraded to pose a problem of a residue after development. The amount of the photosensitive agent is more preferably 1 to 30 wt %.

A method of forming a relief pattern using the photosensitive composition 1 or 2 of the present invention will be described below.

A solution (varnish) of the photosensitive composition 1 or 2 is filtered to remove fine dust, coated on a substrate by a spin coating method or a dipping method, and dried at a temperature of preferably 100° C. or less, thereby forming a photosensitive composition layer. Exposure is performed in accordance with a conventional method by radiating visible light, infrared light, ultraviolet light, or an energy beam such as an electron beam. The exposed photosensitive composition layer is developed by using an aqueous alkali solution by a dipping method, a spray method, or the like. Examples of the aqueous alkali solution are an organic alkali solution such as an aqueous tetramethylammoniumhydroxide solution and an aqueous trimethylhydroxyethylammoniumhydroxide solution and an inorganic alkali solution such as an aqueous potassium hydroxide solution and an aqueous sodium hydroxide solution. After development, rinsing may be performed by using water, alcohol, acetone, or the like as needed.

If the photosensitive composition 1 or 2 is applied to a passivation film or an insulating interlayer, heating is preferably performed by gradually increasing the temperature up to 90° C. to 400° C. after development. This treatment is performed in order to improve heat stability since the photosensitive composition is decomposed at 100° C. to 150° C. and a part of amic acid may not be imidized but remain upon synthesis of the polyimide.

If the photosensitive composition 1 or 2 is applied to a micropatterning photoresist, the composition is heated at 90° C. to 180° C. after development as needed to form a relief pattern. Thereafter, a substrate is processed by dry or wet etching in accordance with a conventional method. In order to form a fine pattern having a width of 3 μm or less, a dry-etching method is preferably performed. As a wet etching agent, an aqueous fluoric acid solution, an aqueous ammonium fluoride solution, or the like is used when a silicon oxide film is to be etched, an aqueous phosphoric acid solution, an aqueous acetic acid solution, an aqueous nitric acid solution, or the like is used when aluminum is to be etched, and an aqueous ammonium cerium nitrate solution or the like is used when a chromium-based film is to be etched. Examples of a dry-etching gas are $CF_4$, $C_2F_6$, $CCl_4$, $BCl_3$, $Cl_2$, $HCl$, and $H_2$. These gases are used in combination of two or more thereof as needed. The etching conditions, e.g., the concentration of a wet-etching agent, the concentration of a dry-etching gas, the temperature, and the time are determined on the basis of a combination of substance on which a fine pattern is to be formed and a photosensitive composition but are not particularly limited. After etching, a relief pattern remaining on the substrate is removed by a peeling agent such as J-100 (tradename) available from Nagase Kasei K.K., an oxygen gas plasma, or the like.

A pattern formation method using the photosensitive composition 1 or 2 and based on a two-layered resist process will be described below.

First, after a polymeric material is coated on a substrate, baking is performed at 100° C. to 250° C. for 30 to 150 minutes to form a lower layer having a predetermined thickness, thereby flattening the surface of the substrate. Examples of the substrate are a silicon wafer, a blank mask, and a Group III-V compound semiconductor wafer having steps of various types of insulating films, electrodes, and wirings formed on the surface. The polymeric material of the lower layer is not particularly limited as long as it has a purity which poses no problem in the manufacture of a semiconductor element and the like. Examples of the polymeric material are a positive resist consisting of substituted o-quinonediazide and a novolak resin, polystyrene, polymethylmethacrylate, polyvinylphenol, a novolak resin, polyester, polyvinylalcohol, polyethylene, polypropylene, polImide, polybutadiene, polyvinylacetate, and polyvinylbutyrai. These resins are used singly or in the form of a mixture of two or more thereof.

The photosensitive composition 1 or 2 described above is coated on the lower layer by, e.g., a spin coating method using a spinner, a dipping method, a spray method, or a printing method and then dried to form an upper layer. Thereafter, the upper layer is exposed and developed to form a desired upper layer pattern. Subsequently, the exposed lower layer is etched by oxygen RIE by using the upper layer pattern as a mask. In this etching, since the photosensitive composition 1 or 2 constituting the upper layer pattern contains silicon as described above, a film consisting of silicon dioxide ($SiO_2$) or a similar substance is formed on the surface of the upper layer pattern when the pattern is exposed to oxygen RIE. As a result, the upper layer pattern obtains an oxygen RIE resistance 10 to 100 times that of the exposed lower layer. Therefore, the lower layer exposed from the upper layer pattern is selectively removed by oxygen RIE to form an optimal pattern profile.

The substrate is processed by dry or wet etching as described above by using the pattern formed by the above steps as a mask. Subsequently, the pattern is removed by the above-mentioned method to complete processing of the substrate.

A resin-encapsulated semiconductor device of the present invention is manufactured by the following method. That is, a solution of the photosensitive composition 1 or 2 is coated on the surface of a semiconductor substrate having elements formed thereon. The solvent is removed by heating, and exposure and development are performed to form a relief pattern. The formed pattern is cured by heating to form a polyimide passivation film. Bonding and the like are performed. The resultant structure is encapsulated by an encapsulating resin to manufacture a resin-encapsulated semiconductor device.

The type of encapsulating resin used in the present invention is not particularly limited, and known epoxy resin compositions can be used. In addition, in order to decrease a stress, modified epoxy resin compositions such as a siloxane-modified phenol novolak epoxy resin (Published Unexamined Japanese Patent Application No. 58-21417) and an alkylphenol-modified phenol novolak epoxy resin (Published Unexamined Japanese Patent Application No. 59-30820) may be used.

Although a low-pressure transfer molding method is most general as the encapsulating method, encapsulation can be also performed by injection molding, compression molding, or cast molding. Note that during molding, a curing temperature of the epoxy resin is preferably 150° C. or more. In addition, postcuring may be performed at a temperature of 160° C. to 190° C. for 2 to 24 hours as needed.

The resin-encapsulated semiconductor device of the present invention uses, as a passivation film, a polyimide film having a very good adhesion property with respect to a film consisting of $SiO_2$, PSG (phosphosilicate glass), or $SiN_x$ and an epoxy-based encapsulating resin. Therefore, the device of the present invention can prevent ingress of water from the interface to effectively prevent corrosion of a metal such as aluminum constituting an LSI circuit, thereby improving reliability of the LSI.

The present invention will be described in more detail below by way of its examples.

EXAMPLE 1

(a) Synthesis of Hydroxy-substituted Polyimide 20 mmol of 3,3 ', 4,4 '-benzophenonetetracarboxylic acid dianhydride ( a4 ), 14 mmol of 2,2-bis( 3-amino-4-hydroxyphenyl )hexafluoropropane (b5), 5 mmol of 4,4 '-diaminodiphenylether (el), and 1 mmol of bis (y-aminopropyl)tetramethyldisiloxane ( d3 ) were reacted in 60 g of dried N-methyl-2-pyrrolidone in a nitrogen atmosphere at 1° C. to 5° C. for five hours. 60 g of xylene were added to the resultant solution, and the solution was poured in a flask having a reflux condenser with a water amount determining device and heated under reflux at 160° C. for six hours. After xylene was removed, the reaction solution was returned to room temperature, and a polymer was reprecipitated in 2l of methanol. The polymer was filtered out and dried by a vacuum dryer at 120° C. for 12 hours to obtain a reddish brown polyimide. The weight of the obtained polyimide (No. 1) was 11 g and its yield was 93%.

(b) Preparation of Photosensitive Composition Varnish 4 g of the polyimide (No. 1) and 1 g of a naphthoquinonediazide compound represented by formula F4 (wherein an average number of D1 is three per molecule) in Table 7 were dissolved in 16 g of N-methylpyrrolidone, and the resultant solution was filtered by a 0.5-$\mu$m mesh membrane filter to prepare a photosensitive composition varnish.

(c) Evaluation of Resolution

The prepared photosensitive composition varnish was coated on a 3-inch silicon wafer by using a spinner and heated on a hot plate at 90° C. for 10 minutes to form a 5.0-$\mu$m thick photosensitive composition layer. The resultant wafer was exposed by a contact exposure machine (PLA501 (tradename) available from CANON INC.) through a quartz mask for a resolution test, dipped in an aqueous alkali solution (NMD3 (tradename) available from Tokyo Ohka K.K. ) as a positive resist developing solution for 60 seconds, and washed with water for 20 seconds, thereby forming a pattern.

A light radiation amount upon pattern formation was 170 mJ/$cm^2$. When a section of the pattern was observed by an electron microscope, 5-$\mu$m wide lines and spaces were resolved.

(d) Evaluation of Adhesion Property

The prepared photosensitive composition varnish was coated on a 3-inch silicon wafer by using a spinner and heated on a hot plate at 90° C. for 10 minutes to from a 5.0-$\mu$m thick photosensitive composition layer. Subsequently, the resultant wafer was sequentially heat-treated at 150° C. for one hour, 250° C. for 30 minutes, and 320° C. for 30 minutes in an oven. This wafer was heated in a 2-atm saturated steam atmosphere at 120° C. for 24 hours, and an adhesion property was evaluated by a 1-$mm^2$checkerboard pattern test method. More specifically, the varnish layer formed on the wafer is diced with a cutter knife, forming a checkerboard pattern consisting of 100 squares each having a side of 1 mm long. Then, adhesive tape was placed on the checkerboard pattern and adhered thereto. Next, the adhesive tape was removed from the pattern, and the varnish-layer squares, which peeled off, were counted. The resultant count was used to evaluate the adhesion property. As a result, the number of peeled samples was zero with respect to 100 samples.

(e) Evaluation of Heat Resistance

The prepared photosensitive composition varnish was coated on a 3-inch silicon wafer by using a spinner and heated on a hot plate at 90° C. for 10 minutes to form a 5.0-μm thick photosensitive composition layer. Subsequently, the resultant wafer was sequentially heat-treated at 150° C. for one hour, 250° C. for 30 minutes, and 320° C. for 30 minutes in an oven. The heat-treated photosensitive composition layer was scraped from the wafer by a razor and subjected to TGA measurement. As a result, no weight reduction was found until a temperature of about 400 ° C.

EXAMPLE 2

(a) Synthesis of Polyimide 20 mmol of 2,2-bis ( 3,4-dicarboxyphenyl )hexafluoropropane dianhydride (a4), 18 mmol of 2,2-bis ( 3-amino-4-hydroxyphenyl ) hexafluoropropane ( b5 ), and 1 mmol of bis(γ-aminopropyl)tetramethyldisiloxane (d3) were reacted in 60 g of dried N-methyl-2-pyrrolidone in a nitrogen atmosphere at 1° C. to 5° C. for five hours. 60 g of xylene were added to the resultant solution, and the solution was poured in a flask having a reflux condenser with a water amount determining device and heated under reflux at 160° C. for six hours. After xylene was removed, the reaction solution was returned to room temperature, and a polymer was reprecipitated in 2l of methanol. The polymer was filtered out and dried by a vacuum dryer at 120° C. for 12 hours to obtain a colorless polyimide. The yield of the obtained the polyimlde (No. 2) was 90%.

(b) Preparation of Photosensitive Composition Varnish 2 g of the polyimide (No. 2) and 0.5 g of a photosensitive agent represented by formula G1 in Table 10 were dissolved in 13 g of cellosolveacetate, and the resultant solution was filtered by a 0.5-μm mesh membrane filter to prepare a photosensitive composition varnish.

(c) Evaluation of Resolution

The prepared photosensitive composition varnish was coated on a 3-inch silicon wafer by using a spinner and heated on a hot plate at 90° C. for 5 minutes to form a 0.8-μm thick photosensitive composition layer. The resultant wafer was exposed by a KrF excimer laser stepper (NA =0.37) for reduction projection exposure at 1/10, dipped in a 1.19% aqueous tetramethylammoniumhydroxide (TMAH) solution for 40 seconds, and washed with water for 20 seconds, thereby forming a pattern.

A light radiation amount upon pattern formation was 100 mJ/m$^2$. When a section of the pattern was observed by an electron microscope, 0.40-μm wide lines and spaces were resolved.

EXAMPLE 3

(a) Preparation of Photosensitive Composition Varnish 2 g of the polyimide (No. 2) and 0.5 g of 4,4'-diazidediphenylsulfone (H10) were dissolved in 13 g of cellosolveacetate, and the resultant solution was filtered by a 0.5-μm mesh membrane filter to prepare a photosensitive composition varnish.

(b) Evaluation of Resolution

The prepared photosensitive composition varnish was coated on a 3-inch silicon wafer by using a spinner and heated on a hot plate at 90° C. for 5 minutes to form a 0.8-μm thick photosensitive composition layer. The resultant wafer was exposed by a KrF excimer laser stepper of (NA =0.37) for reduction projection exposure that 1/10, dipped in a 1.19% aqueous TMAH solution for 40 seconds, and washed with water for 20 seconds, thereby forming a pattern.

A light radiation amount upon pattern formation was 70 mJ/cm$^2$. When a section of the pattern was observed by an electron microscope, 0.45-μm wide lines and spaces were resolved.

EXAMPLE 4

(a) Synthesis of Polyimide 20 mmol of 3,3 ', 4,4 '-benzophenonetetracarboxylic acid dianhydride (a4), 14 mmol of 3,3 '-diamino-4,4 '-dihydroxybiphenyl (b3), and 6 mmol of bis(γ-aminopropyl )octamethyltetrasiloxane ( d6 ) were reacted in 60 g of dried N-methyl-2-pyrrolidone in a nitrogen atmosphere at 1° C. to 5° C. for seven hours. 60 g of xylene were added to the resultant solution, and the solution was poured in a flask having a reflux condenser with a water amount determining device and heated under reflux at 160° C. for five hours. After xylene was removed, the reaction solution was returned to room temperature, and a polymer was reprecipitated in 2l of methanol. The polymer was filtered out and dried by a vacuum dryer at 120° C. for 12 hours to obtain a colorless polyimide. The yield of the obtained polyimide (No. 3) was 85%.

(b) Preparation of Photosensitive Composition Varnish 4 g of the polyimide (No. 3) and 1 g of a naphthoquinonediazide compound represented by formula F4 (wherein an average number of D$_1$ was three per molecule) in Table 7 were dissolved in 25 g of cyclohexanone, and the resultant solution was filtered by a 0.2-μm mesh membrane filter to prepare a photosensitive composition varnish. (c) Evaluation of Resolution of Two-layered Resist After a positive resist (OFPR800 (tradename) available from Tokyo Ohka K.K. ) was coated to have a thickness of 2.0 μm on a 5-inch silicon wafer, the resultant wafer was heated at 200° C. for one hour to form a lower layer for flattening. Subsequently, the prepared photosensitive composition varnish was coated on the lower layer by using a spinner and heated on a hot plate at 90° C. for 30 minutes to form a 0.6-μm thick upper layer. Subsequently, the resultant wafer was exposed by a G-line stepper of (NA =0.45) and developed by an aqueous alkali solution (NDM-W (tradename) available from Tokyo Ohka K.K. ) to form an upper layer pattern. In addition, after the wafer was washed with water, water was removed by spin drying, and postbaking was performed on a hot plate at 130° C. for five minutes.

Subsequently, the resultant wafer was set in a dry-etching apparatus (HiRRIE (tradename) available from Tokuda Seisakusho K.K. ), and the upper layer pattern was transferred to the lower layer by oxygen reactive ion etching (O$_2$ flow rate - 100 sccm, 6 Pa, power =300 W).

When a section of the obtained pattern was observed by an electron microscope, 0.50-μm wide lines and spaces were resolved.

EXAMPLE 5

(a) Synthesis of Polyimide 20 mmol of bis( 3,4-dicarboxyphenyl )tetramethyl-disiloxane dianhydride, 14 mmol of 2,2-his( 3-amino-4-hydroxyphenyl )hexafluoropropane (b5), and 6 mmol of bis(γ-aminopropyl)tetramethyldisiloxane (d3) were reacted in 60 g of dried N-methyl-2-pyrrolidone in a nitrogen atmosphere at 1° C. to 5° C. for five hours. 60 g of xylene were added to the resultant solution, and the solution was poured in a flask having a reflux condenser with a water amount determining device and heated under reflux at 160° C. for six hours. After xylene was removed, the reaction solution was returned to room temperature, and a polymer was reprecipitated in 2l of methanol. The polymer was filtered out and dried by a vacuum dryer at 120° C. for 12 hours to obtain a polyimide (No. 4).

(b) Preparation of Photosensitive Composition Varnish 3 g of the polyimide (No. 4), 1 g of polysiloxane represented by formula J13 in Table 12, and a naphthoquinonediazide compound represented by formula F4 (wherein an average number of $D_1$ was three per molecule) in Table 7 were dissolved in 25 g of ethylcellosolveacerate, and the resultant solution was filtered by a 0.2-μm mesh membrane filter to prepare a photosensitive composition varnish.

(c) Evaluation of Resolution of Two-layered Resist

Following the same procedures as in Example 4, the prepared photosensitive composition varnish was used to coat the photosensitive composition on a lower layer of a silicon wafer, and exposure and development were performed to form an upper layer pattern. In addition, the lower layer was etched by oxygen RIE by using the upper layer pattern as a mask to form a pattern.

When a section of the obtained pattern was observed by an electron microscope, 0.50-μm wide lines and spaces were resolved. In addition, when this pattern was heated on a hot plate at 140° C. for one minute, no deformation was found.

COMPARATIVE EXAMPLE 1

(a) Preparation of Photosensitive Composition Varnish 2 g of polysiloxane represented by formula J13 in Table 13 and 0.5 g of a naphthoquinonediazide compound represented by formula F4 (wherein an average number of $D_1$ was three per molecule) in Table 7 were dissolved in 12 g of ethylcellosolveacetate, and the resultant solution was filtered by a 0.2-μm mesh membrane filter to prepare a photosensitive composition varnish. (b) Evaluation of Two-layered Resist Following the same procedures as in Example 4, the prepared photosensitive composition was used to coat the photosensitive composition (thickness =0.6 μm) on a flattening layer formed on a silicon wafer, and exposure and development were performed to form an upper layer pattern. In addition, a lower layer was etched by oxygen RIE by using the upper layer pattern as a mask to form a pattern.

When the obtained pattern was heated on a hot plate at 90° C. for one minute and observed by a microscope, the pattern was deformed by heat. Examples 6–12 (a) Synthesis of Polyimide Tetracarboxylic acid dianhydride and diamines listed in Table 13 were reacted following the same procedures as in Example 1 to synthesize five types of polyimides (Nos. 5 to 9).

(b) Preparation of Photosensitive Composition Varnish

Polyimides (Nos. 5 to 9) were used to prepare photosensitive compositions having compositions shown in Table 14.

(c) Various Evaluations

These photosensitive compositions were used to perform exposure and development under the conditions shown in Table 14, thereby forming patterns.

A section of each of the obtained patterns was observed by an electron microscope to measure resolution, and a 10% weight loss temperature and an adhesion property were checked. The results are summarized in Table 14.

Note that similar evaluation results of a photosensitive composition containing m,p-cresol novolak resin as a resin component are also summarized in Table 14 as Comparative Example 2.

EXAMPLES 13–19

(a) Synthesis of Amide-ester Compound of 1,2-naphthoquinone-2-diazide-5-sulfonic acid 26.36 g (0.1 mol) of 1,2-naphthoquinone-2-diazide-5-sulfonic acid chloride, 11.3 g (0.05 mol) of 2-(4-aminophenyl)-2-(4'-hydroxyphenyl)propane, and 400 ml of 1,4-dioxane were put in a reaction flask, and a solution prepared by dissolving 15 g of sodium carbonate into 150 ml of water was gradually added to the resultant solution mixture under sufficient stirring. Thereafter, the solution mixture was stirred at room temperature for 15 hours.

The resultant reaction mixture was injected in 1,000 ml of water containing 10 ml of hydrochloric acid to produce a yellow precipitation. The reaction mixture was settled for a while and decanted to discharge a supernatant. Thereafter, 700 ml of methylene chloride and 200 ml of water were added to the reaction mixture to dissolve the precipitation in methylene chloride, thereby extracting a product.

The methylene chloride layer was washed with a 1% aqueous sodium carbonate solution three times, with 250 ml of water twice, and with saturated salt water twice, dried by sodium sulfuric anhydride, and filtered. The methylene chloride solution was evaporated to dryness and dried at a reduced pressure to obtain 26.9 g of a yellowish brown precipitation. The yield of the product was 79%.

An IR spectrum of this product is shown in FIG. 1, and its elemental analysis values are described below.

|  | Elemental analysis value (%) | | | |
| --- | --- | --- | --- | --- |
|  | C | H | N | S |
| Theoretical value | 61.7 | 2.2 | 10.3 | 9.4 |
| Analysis value | 60.9 | 2.1 | 9.7 | 9.7 |

The melting point of this product was 137° C. to 140° C. In accordance with a Uv spectrum, this product had a high absorption peak on a comparatively long wavelength side of 399 nm.

From these results, it was confirmed that this product was an amide-ester (F17) of 2-(4-aminophenyl)-2-(4'-hydroxyphenyl)propane and 1,2-naphthoquinone-2-diazide-5-sulfonic acid.

(b) PHOTOSENSITIVE TEST OF PHOTOSENSITIVE AGENT

The photosensitive agent (F17) was used to form a fine pattern as follows. That is, 10 g of a cresol novolak resin (molecular weight =30,000, calculated in polystyrene eqrdivalent) and 2.5 g of the photosensitlye agent (F17) were dissolved in 40 g of ethylcellosolveacetate, and the resultant solution was filtered by a 0.5-μm mesh membrane filter to prepare a photosensitlye composition varnish. This varnish was spin-coated on a silicon wafer and dried on a hot plate at 90° C. for 20 minutes to form a coating film having a film thickness of 2.5 μm. A test pattern mask was brought into contact with this coating film, and ultraviolet rays were radiated at an exposure amount of 150 mJ/cm$^2$. Thereafter, a 2.0-wt % aqueous solution of tetramethylammoniumhydroxyide was used to perform development at 25° C. for 60 seconds, thereby obtaining a pattern having a line width of 1.0 μm.

(c) SYNTHESIS OF POLYIMIDE

Polyimide (No. 10 )

16.110 g (0.05 mol) of 3,3 ', 4,4 '-benzophenonetetracarboxylic acid dianhydride ( a4 ), 10.906 g ( 0.05 mol ) of pyromellitic acid dianhydride (al), and 100 g of N-methyl-2-pyrrolidone were charged in a reaction flask having a stirring rod, a thermometer, and a dropping funnel, sufficiently stirred, and cooled to 0° C. A solution prepared by dissolving 35.795 g ( 0.095 mol ) of 2,2-his ( 3-amino-4-hydroxyphenyl )hexafluoropropane ( b5 ) and 1.243 g ( 0.005 mol ) of bis (γ-amtnopropyl) tetramethyldisiloxane ( d3 ) in 150 g of N-methyl-2-pyrrolidone was gradually dropped from the dropping funnel into the resultant suspension kept at 0° C. After dropping, stirring was continued at 0° C. to 10° C. for six hours to synthesize polyamic acid. 200 ml of xylene were added to the resultant solution, and the solution was heated under reflux by using an oil bath for two hours, thereby removing xylene together with by-produced water. The resultant solution was cooled to room temperature and then injected into methanol to obtain a precipitate of a polyimide. This precipitate was filtered out and dried at a reduced pressure at 8O° C., thereby obtaining a polyimide (No. 10).

Polyimide (No. 11)

32.22 g (0.10 mol) of 3,3', 4,4 '-benzophenonetetracarboxylic acid dianhydride ( a4 ), 0.07 mol of 3,3 '-dihydroxy-4,4 '-diaminobiphenyl ( b4 ), 5.205 g ( 0. 026 mol ) of 4,4 '-diaminophenyl ether ( el ), 0.994 g ( 0.004 mol ) of bis(γ-aminopropyl)tetramethyldisiloxane (d3), and 210 g of N-methyl-2-pyrrolidone were used to synthesize polyamic acid following the same procedures as described above. 6 g of triethylamine and 23 g of acetic anhydride were added to the resultant solution, and the solution was stirred at a solution temperature of 30° C. for seven hours. This solution was treated following the same procedures as described above to obtain a polyimide (No. 11).

(d) PREPARATION OF PHOTOSENSITIVE COMPOSITION VARNISH (Examples 13 - 18 )

Components were used at mixing ratios shown in Table 15 to prepare photosensitive composition varnishes as follows.

That is, 10 g of a polyimide resin (No. 10 or 11) were dissolved in 35 g of N-methyl-2-pyrrolidone. A predetermined amount of a solution prepared by dissolving 2 g of an amide-ester compound (F17 or F15) of naphthoquinonediazidesulfonic acid as a photosensitive agent in 10 g of cellosolveacetate were added to the resultant solution, and the solution was sufficiently stirred and pressure-filtered by using a 0.5-μm mesh membrane filter, thereby preparing a photosensitive composition varnish.

(Example 19)

10 g of the polyimide (No. 10) were dissolved in 35 g of N-methyl-2-pyrrolidone. A solution prepared by dissolving 2 g of an ester compound (F4, an average number of $D_1$ was three per molecule) of naphthoquinonediazidesulfonic acid as a photosensitive agent in 10 g of cellosolveacetate was added to the resultant solution, and the solution was sufficiently stirred and pressure-filtered by using a 0.5-μm mesh membrane filter, thereby preparing a photosensitive composition varnish.

(e) Evaluation of Resolution

Each varnish of Examples 13 to 18 was spin-coated on a 4-inch silicon wafer to have a film thickness of 4 μm and dried at 90° C. for 20 minutes. Subsequently, ultraviolet rays (405 nm, 11.0 mw/cm$^2$) were radiated from an exposure apparatus (PLA501F (tradename) available from CANON CORP. ) through a predetermined mask for 40 seconds. This wafer was developed by 3% tetramethylammonium hydroxide for 60 seconds. As a result, in each of developed wafers, almost no erosion was found in a nonexposed portion and a good pattern was obtained. In addition, a heat treatment was performed at 90° C. for 30 minutes, 150° C. for 30 minutes, 250° C. for 30 minutes, and 320° C. for 30 minutes. As a result, in each of the heat-treated wafers, no disturbance was found in the 10 pattern, and a line width of 3 to 5 μm could be sufficiently discriminated. These results are summarized in Table 15.

(f) Evaluation of Heat Resistance

Each photosensitive composition varnish of Examples 13 and 14 was coated on a wafer and sequentially heat-treated at 90 ° C. for 30 minutes, 150 ° C. for 30 minutes, 250° C. for 30 minutes, and 320° C. for 30 minutes. Thereafter, a loss in weight of the polyimide film was measured by a thermobalance (in an N$_2$ gas atmosphere, heating rate =10° C./min. ) As a result, a 5-wt % weight loss temperature was 463° C. in Example 13 (using polyimide No. 10) and 459° C. in Example 14 (using polyimide No. 11).

(g) Evaluation of Adhesion Property

The photosensitive composition varnish of each of Examples 13, 14, and 19 was used to perform the following evaluation.

(1) Adhesion property with respect to PSG (phosphosilicate glass) film

The photosensitive composition varnish was coated on a silicon wafer having a PSG film by a spin-coating method, and a square silicon chip of a 2-ram side having a PSG film was placed thereon. The resultant structure was dried at 90° C. for 30 minutes and sequentially heat-treated at 150° C. for 30 minutes, 250° C. for one hour, and 350° C. for 30 minutes, thereby forming a polymer film adjusted to have a thickness of about 5 μm. A shearing breaking strength of a square chip of a 2-mm side was measured for a sample just manufactured (0 h) and a sample left to stand after the manufacture in a pressure cooker containing saturated steam at 120° C. for 200 hours.

(2) Adhesion property with respect to semiconductor encapsulating epoxy resin

The photosensitive composition varnish was coated on a silicon wafer having a PSG film by a spin-coating method and heat-treated at 90° C. for 30 minutes, 150° C. for 30 minutes, 250° C. for one hour, and 350° C. for 30 minutes, thereby forming a polymer film adjusted to have a thickness of about 5 μm. Subsequently, this silicon wafer with a polyimide film was diced into a size of 10 mm×30 ram, and a semiconductor encapsulating epoxy resin (KE-300TS (tradename) available from TOSHIBA CHEMICAL CORP.) was used to form a square encapsulating resin of a 3-mm side on the silicon wafer by using a low-pressure transfer molding machine at a temperature of 175° C. and a pressure of 80 kg/cm² for three minutes. Following the same procedures as in item (1) above, a shearing breaking strength of the encapsulating resin was measured for a sample just manufactured (0 h) and a sample left to stand after the manufacture in a pressure cooker containing saturated steam at 120° C. for 200 hours.

The results are summarized in Table 16. As is apparent from Table 16, an adhesion property was further improved when an amide-ester compound of naphthoquinonediazidesulfonic acid was used.

Additional advantages and modifications will readily occur to those skilled in the art. Therefore, the invention in its broader aspects is not limited to the specific details, and materials, shown and described herein. Accordingly, various modifications may be made without departing from the spirit or scope of the general inventive concept as defined by the appended claims and their equivalents.

TABLE 1

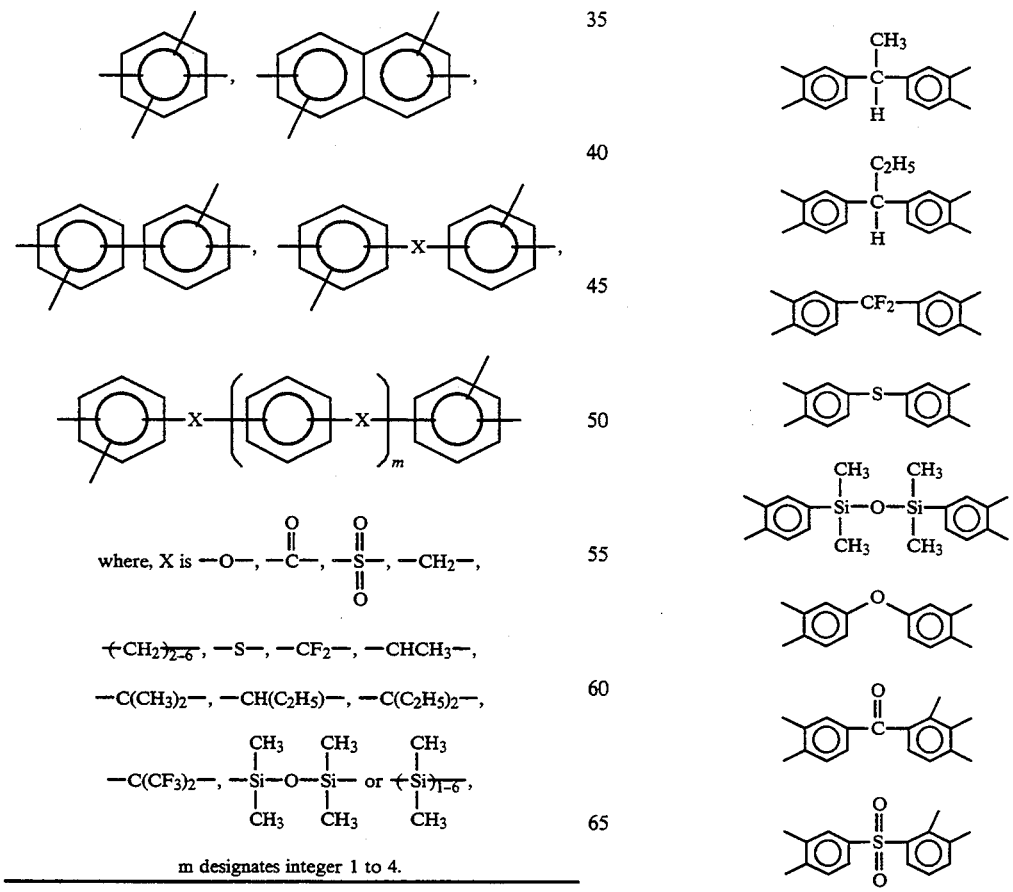

TABLE 2

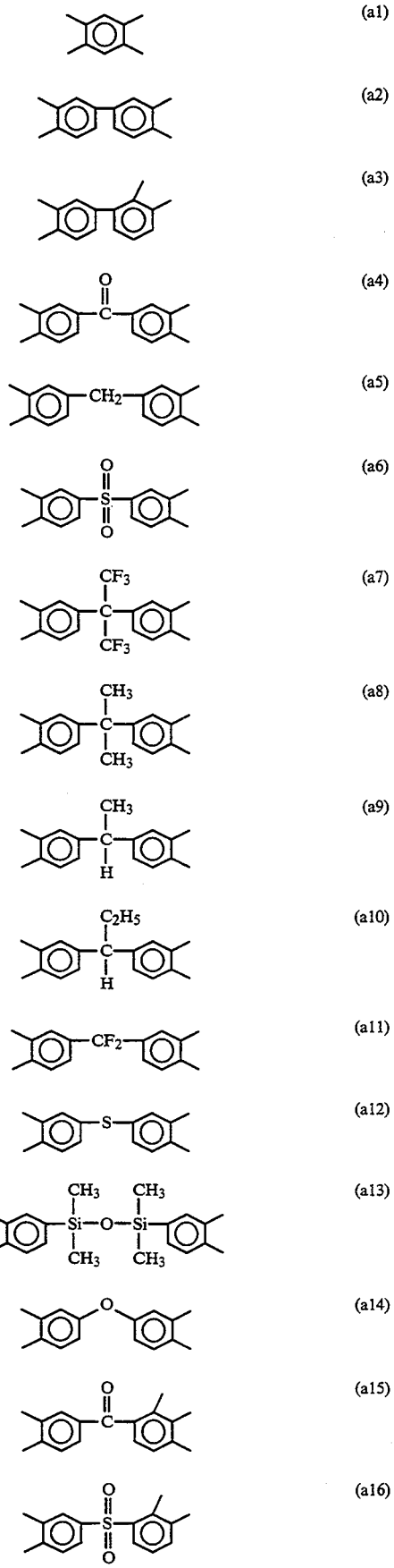

TABLE 2-continued
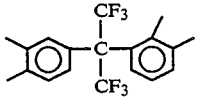 (a17)
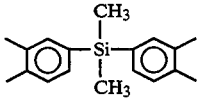 (a18)
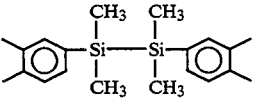 (a19)
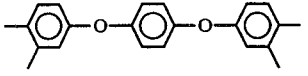 (a20)
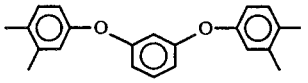 (a21)
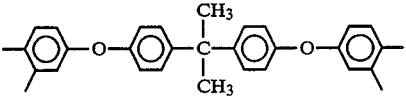 (a22)
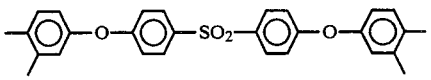 (a23)
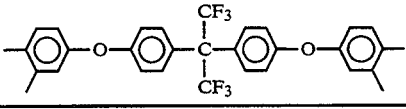 (a24)
TABLE 3
 (b1)
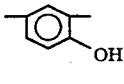 (b2)
 (b3)
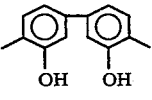 (b4)
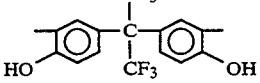 (b5)
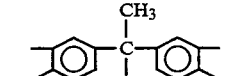 (b6)
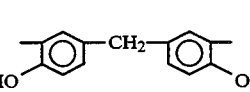 (b7)
TABLE 3-continued
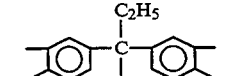 (b8)
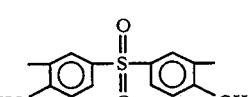 (b9)
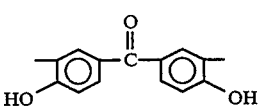 (b10)
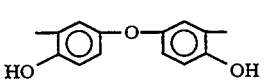 (b11)
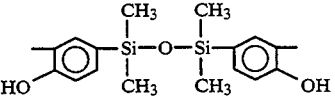 (b12)
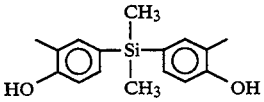 (b13)
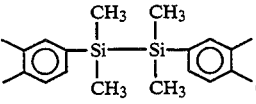 (b14)
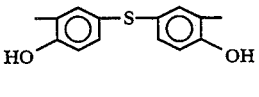 (b15)
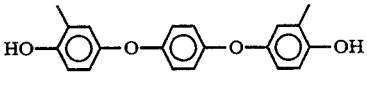 (b16)
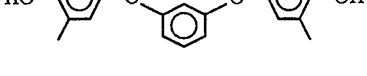 (b17)
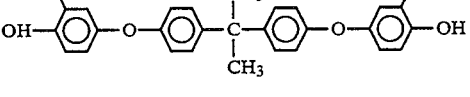 (b18)
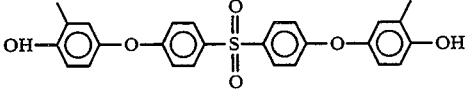 (b19)
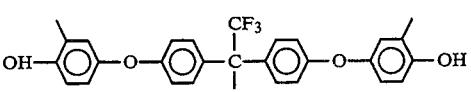 (b20)
TABLE 4
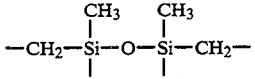 (d1)

TABLE 4-continued $$-(CH_2)_2-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_2- \quad (d2)$$

$$-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3- \quad (d3)$$

(d4) — $-CH_2-\text{Ph}-\underset{\underset{CH_3}{|}}{\overset{\overset{CH_3}{|}}{Si}}-O-\underset{\underset{CH_3}{|}}{\overset{\overset{CH_3}{|}}{Si}}-\text{Ph}-CH_2-$ (d5) $-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-O-\underset{\underset{CH_3}{|}}{\overset{\overset{-CH_3}{|}}{Si}}-(CH_2)_3-$ (d6) $-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-O-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3-$ $$-CH_2-\underset{\underset{CH_3}{|}}{\overset{\overset{CH_3}{|}}{Si}}-CH_2- \quad (d7)$$

$$-CH_2-\underset{\underset{CH_3}{|}}{\overset{\overset{CH_3}{|}}{C}}-CH_2-\underset{\underset{CH_3}{|}}{\overset{\overset{CH_3}{|}}{Si}}-O-\underset{\underset{CH_3}{|}}{\overset{\overset{CH_3}{|}}{Si}}-CH_2-\underset{\underset{CH_3}{|}}{\overset{\overset{CH_3}{|}}{C}}-CH_2- \quad (d8)$$

$$-CH_2-\underset{\underset{CH_3}{|}}{\overset{\overset{CH_3}{|}}{Si}}\left(O-\underset{\underset{CH_3}{|}}{\overset{\overset{CH_3}{|}}{Si}}\right)_5 CH_2- \quad (d9)$$

$$-(CH_2)_3-\underset{\underset{CH_3}{|}}{\overset{\overset{CH_3}{|}}{Si}}\left(O-\underset{\underset{CH_3}{|}}{\overset{\overset{CH_3}{|}}{Si}}\right)_6 (CH_2)_3- \quad (d10)$$

TABLE 5

(e1) —Ph—O—Ph—

(e2) —Ph—

(e3) —Ph—CH$_2$—Ph—

(e4) —Ph—C(=O)—Ph—

(e5) —Ph—S(=O)$_2$—Ph—

(e6) —Ph—C(CH$_3$)$_2$—Ph—

(e7) —Ph—CF$_2$—Ph—

(e8) —Ph—C(CF$_3$)$_2$—Ph—

TABLE 5-continued (e17) [structure: −⟨phenyl⟩−CH₂−⟨phenyl⟩−CH₂−⟨phenyl⟩−]

(e18) [structure: −⟨phenyl⟩−O−⟨phenyl⟩−C(CH₃)₂−⟨phenyl⟩−O−⟨phenyl⟩−]

(e19) [structure: −⟨phenyl⟩−O−⟨phenyl⟩−C(=O)−⟨phenyl⟩−O−⟨phenyl⟩−]

(e20) [structure: −⟨phenyl⟩−O−⟨phenyl⟩−S(=O)₂−⟨phenyl⟩−O−⟨phenyl⟩−]

(e21) [structure: −⟨phenyl⟩−O−⟨phenyl⟩−C(CF₃)₂−⟨phenyl⟩−O−⟨phenyl⟩−]

(e22) [structure: −⟨phenyl⟩−C(CH₃)₂−⟨phenyl⟩−O−⟨phenyl⟩−S(=O)₂−⟨phenyl⟩−O−⟨phenyl⟩−C(CH₃)₂−⟨phenyl⟩−]

(e23) [structure: −⟨phenyl⟩−C(CH₃)₂−⟨phenyl⟩−O−⟨phenyl⟩−C(=O)−⟨phenyl⟩−O−⟨phenyl⟩−C(CH₃)₂−⟨phenyl⟩−]

(e24) [structure: −⟨phenyl⟩−O−⟨phenyl⟩−O−⟨phenyl⟩−O−⟨phenyl⟩−O−⟨phenyl⟩−]

(e25) −CH₂−Si(CH₃)₂−⟨phenyl⟩−Si(CH₃)₂−CH₂−

TABLE 6

D₄: 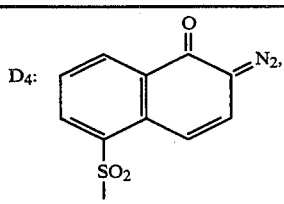

D₅: 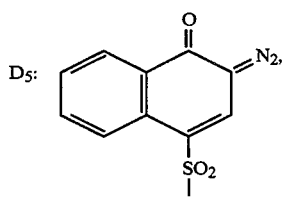

TABLE 6-continued

D₆: 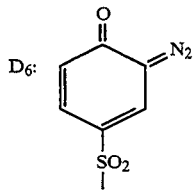

TABLE 7

(F1) 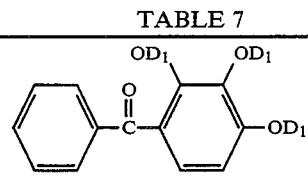

TABLE 7-continued
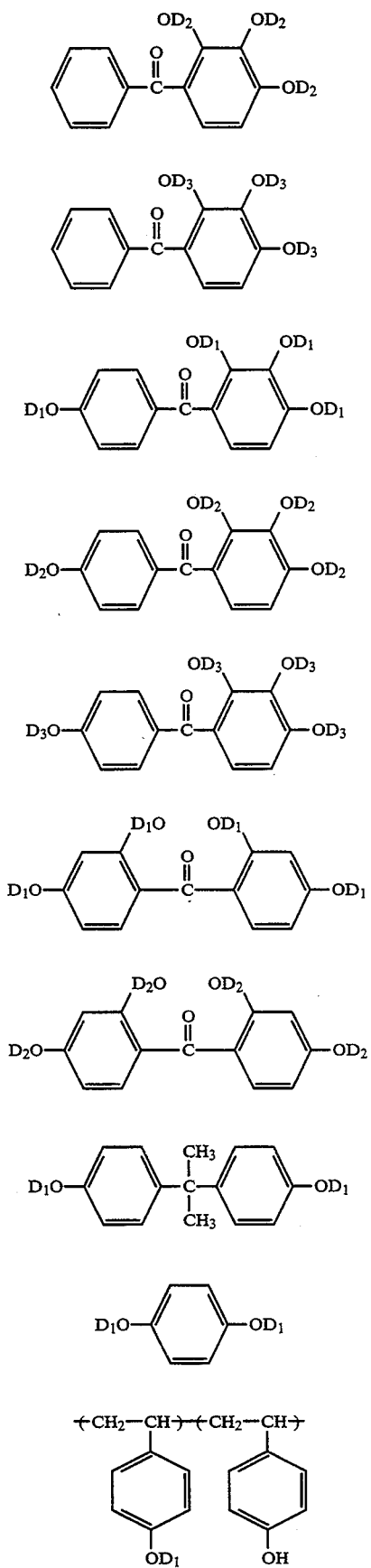
(F2) (F3) (F4) (F5) (F6) (F7) (F8) (F9) (F10) (F11)
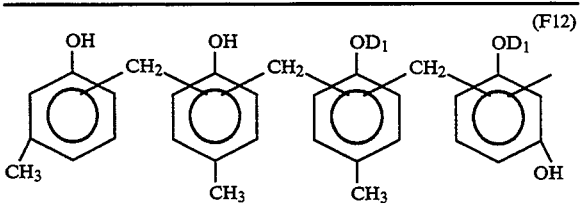
(F12)
TABLE 8
$$\underset{H}{DN}-R-OD$$
where R is
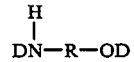
,
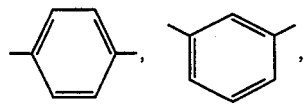
,
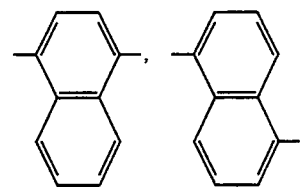
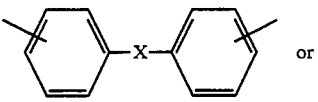 or
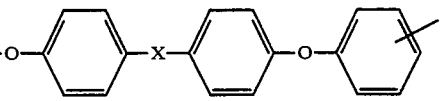
where X is
single bond, —O—, —CH$_2$—, —SO$_2$—, —CO—,
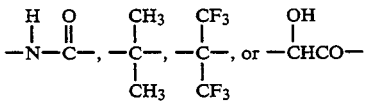
A hydrogen atom in the aromatic ring may be substituted by alkyl group, halogen atom or hydroxyl group.
TABLE 9
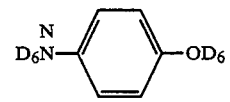
(F13)
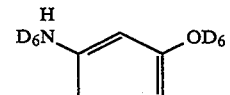
(F14)
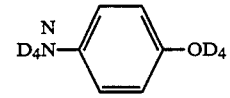
(F15)

TABLE 9-continued
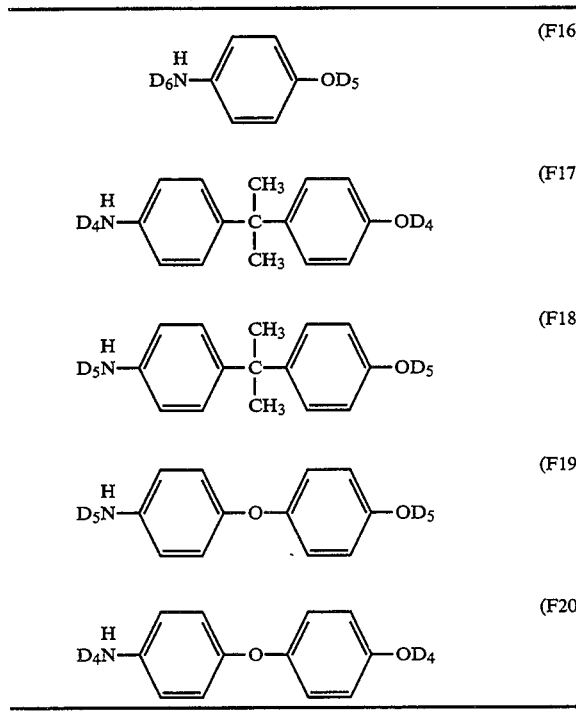
TABLE 10
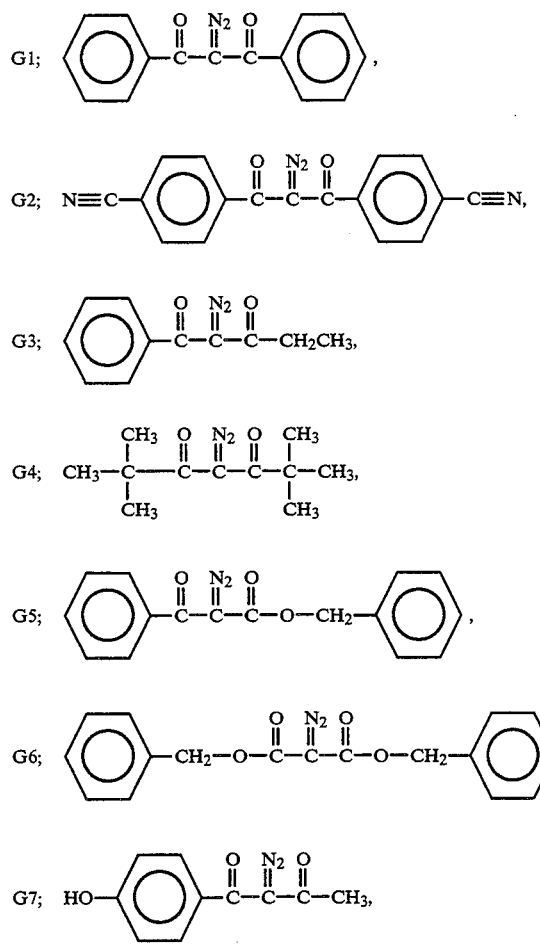
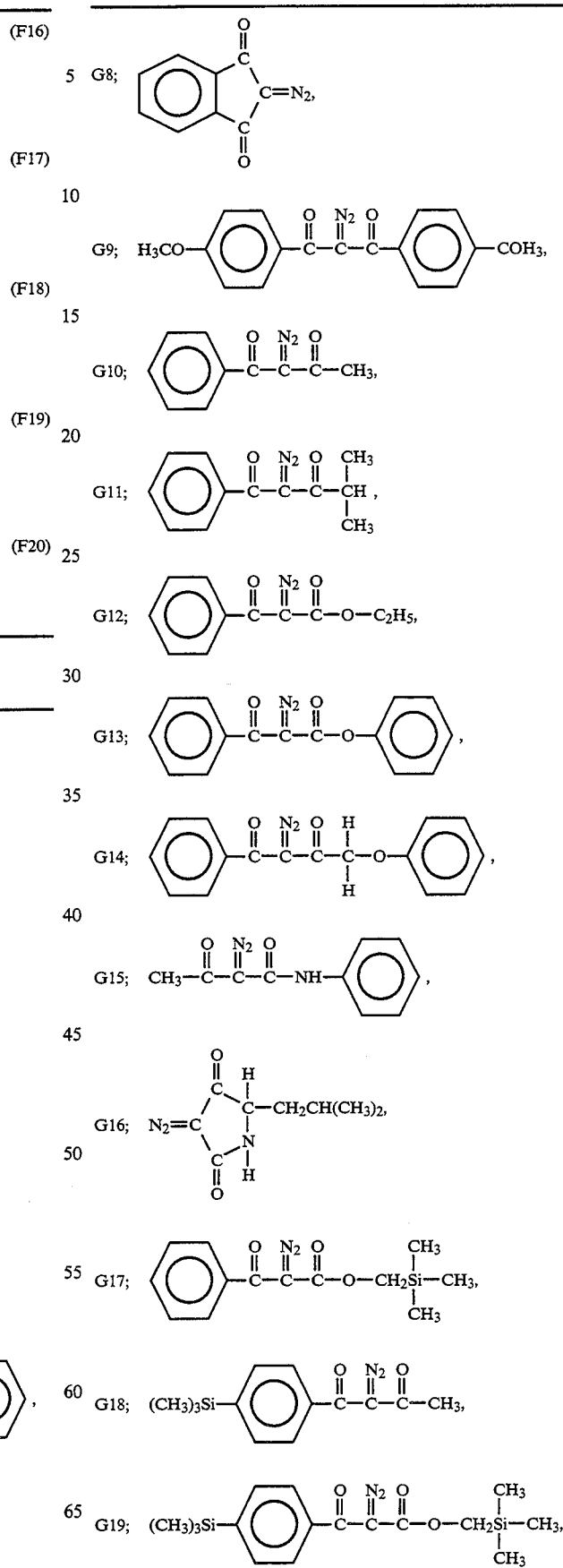

TABLE 10-continued

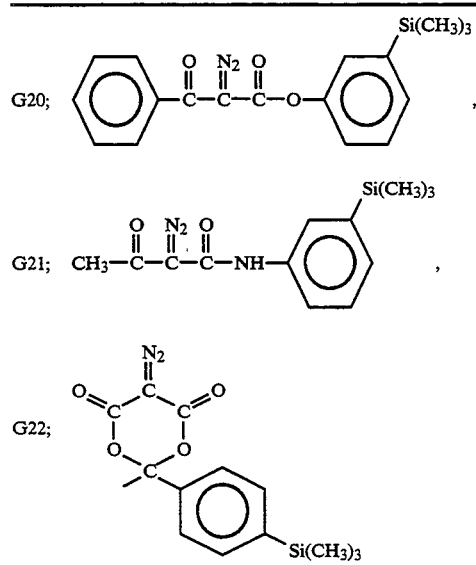

TABLE 11

| H1 | 4,4'-diazidechalcone |
|---|---|
| H2 | 2,6-bis(4-azidebenzal)cyclohexanone |
| H3 | 2,6-bis(4-azidebenzal)-4-methylenecyclohexanone |
| H4 | 1,3-bis(4-azeidebenzal)-2-propanone |
| H5 | 1,3-bis(4-azeidecinnamylidene)-2-propanone |
| H6 | 4,4'-diazidestilbene |
| H7 | 4,4'-diazidebiphenyl |
| H8 | 4,4'-diazidebiphenylsulfide |
| H9 | 3,3'-diazidebiphenylsulfide |
| H10 | 4,4'-diazidebiphenylsulfone |

TABLE 12

J1: poly(p-vinylphenol)

J2: poly(o-vinylphenol)

J3: poly(m-isopropenylphenol)

J4: m,p-cresol novolak resin

J5: xylesol novolak resin

J6: copolymer of p-vinylphenol and methylmethacrylate

J7: copolymer of p-isopropenylphenol and maleic acid anhydride

J8: poly(methacrylic acid)

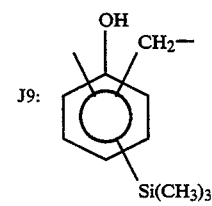

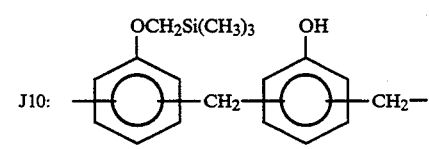

TABLE 12-continued

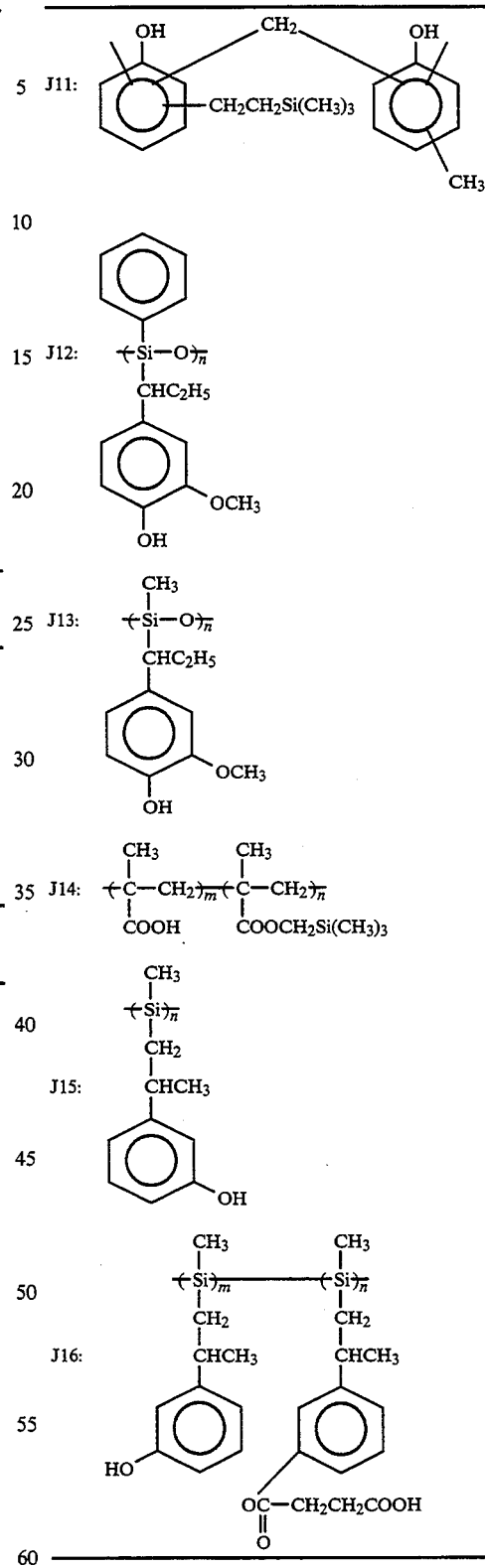

TABLE 13

| No. | Tetracarboxylic acid dianhydride (mol) | | diamine (mol) | | |
|---|---|---|---|---|---|
| | | | $H_2N$-b-$N_2H$ | $H_2N$-d-$N_2H$ | $H_2N$-e-$N_2H$ |
| 5 | a6 | a1 | b5 | d2 | e3 |
| | 0.6 | 0.2 | 0.8 | 0.1 | 0.1 |
| 6 | a6 | a8 | b3 | d2 | e5 |

TABLE 13-continued

| No. | Tetracarboxylic acid dianhydride (mol) | diamine (mol) | | |
|---|---|---|---|---|
| | | $H_2N-b-N_2H$ | $H_2N-d-N_2H$ | $H_2N-e-N_2H$ |
| | 0.8 | 0.2 | 0.8 | 0.1 | 0.1 |
| 7 | a14 | — | b5 | d2 | e20 |
| | 1.0 | — | 0.7 | 0.05 | 0.25 |
| 8 | a17 | — | b3 | d2 | e2 |
| | 1.0 | — | 0.7 | 0.2 | 0.1 |
| 9 | a4 | — | b3 | d2 | — |
| | 1.0 | — | 0.7 | 0.3 | — |

TABLE 14

| | Photosensitive composition | | | | |
|---|---|---|---|---|---|
| | Polyimide (upper row, No. in table 13, lower row; mixing amount) | Photosensitive agent (Lower row, mixing amount) | Solvent: mixing amount in parentheses | Coating film thickness (μm) | Exposure apparatus |
| Example 6 | No. 5 | F1 | N-methyl | 6.0 | g-line stepper |
| | 4 g | 1 g | pyrrolidone (20 g) | | |
| Example 7 | No. 6 | F4 | N-methyl | 5.0 | PLA (Tradename) available |
| | 4 g | 1 g | pyrrolidone (20 g) | | from CANON CORP. |
| Example 8 | No. 6 | F4 | N-methyl | 1.2 | i-line stepper |
| | 4 g | 1 g | pyrrolidone (30 g) | | |
| Example 9 | No. 8 | G1 | Pimethylformamid | 0.6 | KrF excimer |
| | 4 g | 1 g | (30 g) | | laser stepper |
| Example 10 | No. 8 | H1 | Pimethy- | 0.6 | KrF excimer |
| | 4 g | 1 g | lacetamide (30 g) | | laser stepper |
| Example 11 | No. 7 | F4 | N-methyl | 5.5 | PLA (Tradename) available |
| | 4 g | 1 g | pyrrolidone (20 g) | | from CANON CORP. |
| Example 12 *3 | No. 9 | F4 | N-methyl | 0.5 | g-line stepper |
| | 2 g | 1 g | pyrrolidone (30 g) | | |
| Comparative Example 2 | m,p-cresol novolak resin 4 g | F4 1 g | Ethylcellosolve acetate (20 g) | 1.2 | i-line stepper |

| | Sensitivity (mJ/cm$^2$) | Developing solution | Resolution (μm) | 10% weight loss temperature *1 (°C.) | Adhesion property (checkerboard pattern test) *2 | Remarks |
|---|---|---|---|---|---|---|
| Example 6 | 200 | 1.19% aqueous TMAH solution | 5.0 | 420 | 3/100 | |
| Example 7 | 150 | TM-3 *4 | 6.0 | 450 | 0/100 | |
| Example 8 | 100 | NMD-W *5 | 0.6 | — | — | Pattern deformation temperature = 140° or more |
| Example 9 | 100 | NMD-3 *6 | 0.45 | — | — | |
| Example 10 | 80 | NMD-3 | 0.50 | — | — | |
| Example 11 | 170 | NMD-3 | 6.0 | 430 | 0/100 | |
| Example 12 | 80 | NMD-3 | 0.5 | — | — | |
| Comparative Example 2 | 100 | NMD-W | 0.6 | — | — | Pattern deformation temperature = 120° |

*1 According to TGA measurement after 350° cure.
*2 An adhesion property with respect to a silicon wafer after heating in a 2-atm saturated steam for 24 hours.
*3 2 g of J13 (alkali-soluble resin) listed in Table 12 are mixed in a photosensitive composition of Example 12.
*4 Tradename available from Tama Kagaku Kogyo K.K.
*5 Tradename available from Tokyo Ohka K.K.
*6 Tradename available from Tokyo Ohka K.K.

TABLE 15

| | Example | | | | | |
|---|---|---|---|---|---|---|
| | 13 | 14 | 15 | 16 | 17 | 18 |
| Polyimide (No. 10) (g) | 10 | — | 10 | 10 | — | — |
| Polyimide (No. 11) (g) | — | 10 | — | — | 10 | 10 |
| N-methyl-2-pyrrolidone (g) | 35 | 35 | 35 | 35 | 35 | 35 |
| Photo-sensitive agent (F17) (g) | 2 | 2 | — | — | 1 | — |
| Photo-sensitive agent (F15) (g) | — | — | 2 | 1 | 1 | 2 |
| Cellosolve-acetate (g) | 10 | 10 | 10 | 10 | 10 | 10 |
| Pattern Processibility | Good | Good | Good | Good | Good | Good |

TABLE 15-continued

| | Example | | | | | |
|---|---|---|---|---|---|---|
| | 13 | 14 | 15 | 16 | 17 | 18 |
| Line width (μm) | 4 | 3 | 4 | 4 | 4 | 5 |

TABLE 16

| | | Example | | |
|---|---|---|---|---|
| | | 13 | 14 | 19 |
| Adhesion strength with respect to PSG film [kg/mm$^2$] | 0 h | 2.2 | 2.3 | 2.2 |
| | 100 h | 1.6 | 1.9 | 0.9 |
| Adhesion strength with respect to encapsulating resin [kg/mm$^2$] | 0 h | 4.0 | 4.3 | 4.1 |
| | 100 h | 2.9 | 3.3 | 2.1 |

What is claimed is:

1. A positive photosensitive composition comprising: a photosensitive agent comprising an amide-ester compound of naphthoquinonediazidesulfonic acid or benzoquinonediazide-sulfonic acid represented by the following formula:

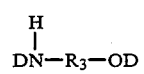

wherein $R_3$ represents a divalent aromatic group and D represents a residual group of naphthoquinonediazide-sulfonic acid or benzoquinonediazidesulfonic acid; in admixture with polyimide having repeating units represented by the following Formulas (I) and (II)

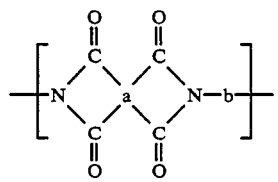
(I)

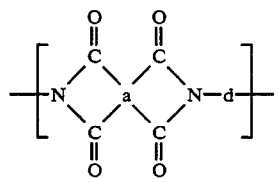
(II)

wherein a represents a tetravalent aromatic group, b represents a divalent aromatic group having a hydroxyl group, and d represents a divalent group containing silicon represented by the following Formula (III):

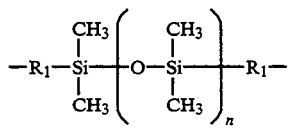
(III)

wherein $R_1$ represents a substituted or unsubstituted alkylene group having 1 to 10 carbon atoms, a substituted or unsubstituted aromatic group having 1 to 10 carbon atoms, and n represents an integer of 1 to 6;

wherein 0.1 to 50 parts by weight of said photosensitive agent are contained with respect to 100 parts by weight of said polyimide.

2. A positive photosensitive composition comprising:
a photosensitive agent comprising an amide-ester compound of naphthoquinonediazidesulfonic acid or benzoquinonediazide-sulfonic acid represented by the following formula:

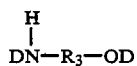
$$DN-R_3-OD$$

wherein $R_3$ represents a divalent aromatic group an D represents a residual group of naphthoquinonediazidesulfonic acid of benzoquinonediazidesulfonic acid; in admixture with
a polyimide having repeating units represented by the following Formulas (I), (II), and (IV):

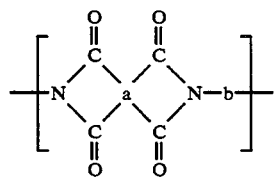
(I)

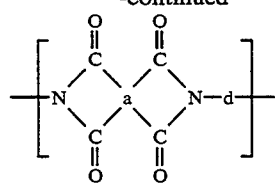
(II)

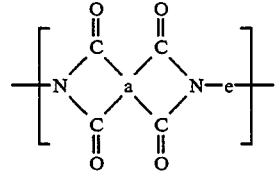
(IV)

wherein a represents a tetravalent aromatic group, b represents a divalent aromatic group having a hydroxy group, d represents a divalent group containing silicon represented by the following Formula (III):

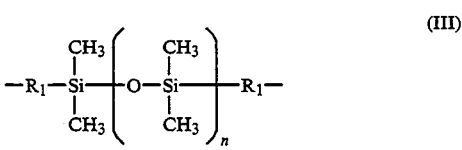
(III)

wherein $R_1$ represents a substituted or unsubstituted alkylene group having 1 to 10 carbon atoms, a substituted or unsubstituted aromatic group having 1 to 10 carbon atoms, and n represents an integer of 1 to 6, and e represents a divalent aromatic group;

wherein 0.1 to 50 parts by weight of said photosensitive agent are contained with respect to 100 pats by weight of said polyimide.

3. A composition according to claim 1, wherein 1 to 30 parts by weight of said photosensitive agent are contained with respect to 100 parts by weight of said polyimide.

4. A composition according to claim 2, wherein 1 to 30 parts by weight of said photosensitive agent are contained with respect to 100 parts by weight of said polyimide.

5. A composition according to claim 1 wherein 80 to 99 mol % of said repeating unit (I) and 1 to 20 mol % of said repeating unit (II) are contained, and said photosensitive composition is used as a passivation film..

6. A composition according to claim 5, wherein 85 to 95 mol % of said repeating unit (I) and 5 to 15 mol % of said repeating unit (II) are contained.

7. A composition according to claim 2, wherein 40 to 98 mol % of said repeating unit (I), 1 to 20 mol % of said repeating unit (II), and 1 to 40 mol % of said repeating unit (Iv) are contained, and said photosensitive composition is used as a passivation film.

8. A composition according to claim 7, wherein 60 to 93 mol % of said repeating unit (I), 2 to 15 mol % of said repeating unit (II), and 5 to 25 mol % of said repeating unit (IV)are contained.

9. A composition according to claim 1, wherein 50 to 99 mol % of said repeating unit (I) and 1 to 50 mol % of said repeating unit (II) are contained, and said photosensitive composition is used as a monolayered resist.

10. A composition according to claim 9, wherein 70 to 95 mol % of said repeating unit (I) and 5 to 30 mol % of said repeating unit (II) are contained.

11. A composition according to claim 2, wherein 40 to 98 mol % of said repeating unit (I), 1 to 20 mol % of said repeating unit (II), and 1 to 40 mol % of said repeating unit (IV) are contained, and said photosensitive composition is used as a monolayered resist.

12. Composition according to claim 1, wherein 60 to 93 mol % of said repeating unit (I), 2 to 15 mol % of said repeating unit (II), and 5 to 25 mol % of said repeating unit (IV) are contained.

13. A composition according to claim 1, wherein 50 to 90 mol % of said repeating unit (I) and 10 to 50 mol % of said repeating unit (II) are contained, and said photosensitive composition is used as an upper layer of a two-layered resist.

14. A composition according to claim 23, wherein 55 to 80 mol % of said repeating unit (I) and 20 to 45 mol % of said repeating unit (II) are contained.

15. A composition according to claim 2, wherein 40 to 89 mol % of said repeating unit (I), 10 to 45 mol % of said repeating unit (II), and 1 to 15 mol % of said repeating unit (Iv) are contained, and said photosensitive composition is used as an upper layer of a two-layered resist.

16. A composition according to claim 15, wherein 45 to 83 mol % of said repeating unit (I), 15 to 40 mol % of said repeating unit (II), and 2 to 15 mol % of said repeating unit (Iv) are contained.

17. A resin-encapsulated semiconductor device comprising:
a passivation film coated on a surface of a semiconductor substrate having an element, and consisting of a photosensitive composition according to claim 1; and
an encapsulating resin for encapsulating said semiconductor substrate.

18. A resin-encapsulated semiconductor device comprising:
a passivation film coated on a surface of a semiconductor substrate having an element, and consisting of a photosensitive composition according to claim 2; and
an encapsulating resin for encapsulating said semiconductor substrate.

* * * * *